US008962094B2

(12) United States Patent
Taylor et al.

(10) Patent No.: US 8,962,094 B2
(45) Date of Patent: Feb. 24, 2015

(54) PLURAL COMPONENT COATING APPLICATION SYSTEM WITH A COMPRESSED GAS FLUSHING SYSTEM AND SPRAY TIP FLIP MECHANISM

(75) Inventors: Sidney Taylor, Houston, TX (US); Stanley Rogala, Katy, TX (US); Ivan Belik, Spring, TX (US); Miles Wenger, Blind Bay (CA)

(73) Assignee: Line Travel Automated Coating Inc. (CA)

( * ) Notice: Subject to any disclaimer, the term of this patent is extended or adjusted under 35 U.S.C. 154(b) by 681 days.

(21) Appl. No.: 13/166,230

(22) Filed: Jun. 22, 2011

(65) Prior Publication Data

US 2011/0311716 A1 Dec. 22, 2011

Related U.S. Application Data

(60) Provisional application No. 61/357,478, filed on Jun. 22, 2010.

(51) Int. Cl.
*C23C 16/52* (2006.01)
*B05B 13/04* (2006.01)
(Continued)

(52) U.S. Cl.
CPC ........... *B05B 13/0436* (2013.01); *B05B 7/0408* (2013.01); *B05B 7/26* (2013.01); *B05B 9/002* (2013.01); *B05B 9/0423* (2013.01); *B05B 12/084* (2013.01); *B05B 12/087* (2013.01); *B05B 15/025* (2013.01); *B05D 1/02* (2013.01); *B05D 1/34* (2013.01); *B05D 2254/02* (2013.01)
USPC ................ 427/455; 427/8; 427/449; 427/456

(58) Field of Classification Search
USPC ...................................... 427/8, 455, 449, 456
See application file for complete search history.

(56) References Cited

U.S. PATENT DOCUMENTS 3,799,403 A 3/1974 Probst et al.
3,873,023 A 3/1975 Moss et al.
(Continued)

FOREIGN PATENT DOCUMENTS

DE 4134598 A1 4/1993

OTHER PUBLICATIONS

Notification concerning transmittal of international preliminary report on patentability (Chapter I of the PCT) & Written Opinion of International Searching Authority, 12 pages, Jan. 10, 2013.
(Continued)

*Primary Examiner* — Nathan T Leong
(74) *Attorney, Agent, or Firm* — Charles S. Knobloch; Arnold, Knobloch & Saunders, L.L.P.

(57) ABSTRACT

A system for purging a plural component coating application system including: a first pressure regulator for receiving an inert gas, providing the gas at a first pressure; a first valve; a first operator connected to the first valve capable of being controlled by a logic controller; a first check valve; a mixing manifold; a second pressure regulator for receiving an inert gas, providing the gas at a second pressure that is less than the first pressure; a second valve; a second operator connected to the second valve capable of being controlled by a logic controller; a second check valve; a static mixer in fluid communication with the mixing manifold; an outlet from the static mixer for receiving a connection to at least two spraying members; and where the second regulator is capable of providing the second pressure at a pressure that is less than one-fifth of the first pressure.

8 Claims, 10 Drawing Sheets

(51) Int. Cl.

| | |
|---|---|
| ***B05B 7/04*** | (2006.01) |
| ***B05B 7/26*** | (2006.01) |
| ***B05B 9/00*** | (2006.01) |
| ***B05B 9/04*** | (2006.01) |
| ***B05B 12/08*** | (2006.01) |
| ***B05B 15/02*** | (2006.01) |
| ***B05D 1/02*** | (2006.01) |
| *B05D 1/34* | (2006.01) |

(56) References Cited

U.S. PATENT DOCUMENTS

| | | | | | |
|---|---|---|---|---|---|
| 4,325,513 | A | | 4/1982 | Smith et al. | |
| 4,535,000 | A | | 8/1985 | Gordon | |
| 4,818,298 | A | * | 4/1989 | Shishkin et al. | 134/22.11 |
| 4,953,496 | A | | 9/1990 | Taylor et al. | |
| 4,962,724 | A | * | 10/1990 | Prus et al. | 118/688 |
| 5,129,355 | A | | 7/1992 | Taylor et al. | |
| 5,163,584 | A | | 11/1992 | Huber et al. | |
| 5,207,833 | A | * | 5/1993 | Hart | 118/307 |
| 5,219,097 | A | | 6/1993 | Huber et al. | |
| 5,458,683 | A | | 10/1995 | Taylor et al. | |
| 6,214,420 | B1 | * | 4/2001 | Girardin et al. | 427/455 |
| 6,227,228 | B1 | | 5/2001 | Fullenbach | |
| 6,881,266 | B1 | | 4/2005 | Daykin et al. | |
| 7,066,186 | B2 | | 6/2006 | Bahr | |
| 2002/0000193 | A1 | | 1/2002 | Kitano et al. | |
| 2007/0196585 | A1 | * | 8/2007 | Corbett et al. | 427/409 |

OTHER PUBLICATIONS

Notification of transmittal of the International Search Report and the Written Opinion of the International Searching Authority, or the Declaration dated Oct. 4, 2010, based on PCT/US10/39546 filed Jun. 22, 2010, 15 pages.

* cited by examiner

PLURAL COMPONENT COATING APPLICATION SYSTEM WITH A COMPRESSED GAS FLUSHING SYSTEM AND SPRAY TIP FLIP MECHANISM

CROSS-REFERENCE TO RELATED APPLICATIONS

This application claims the benefit of U.S. Provisional Application No. 61/357,478 of filing date Jun. 22, 2010. International Application Number PCT/US10/39546 of filing date Jun. 22, 2010 contains the same material as U.S. Provisional Application No. 61/357,478 of filing date Jun. 22, 2010 and is hereby disclosed.

BACKGROUND OF THE INVENTION

1. Field of the Invention

This invention relates to plural component coating application systems and more particularly to compressed gas flushing systems used to clean the component delivery portions of plural component coating application systems.

2. Background

U.S. Pat. No. 5,458,683 to Taylor, et al. discloses a pipeline treating apparatus having a pair of pivotally mounted housing sections and a pair of separately pivotal nozzle frames. A drive mechanism on the nozzle frames oscillates the nozzle plate a predetermined arcuate distance around the circumference of the pipeline so that the nozzles treat the entire outer surface of the pipeline. A travel unit drives a cleaning unit along the pipeline, while a motor oscillates the nozzles. Taylor does not disclose variation of the oscillation frequency or the rate of travel based on flow rate.

U.S. Pat. No. 6,881,266 to Daykin et al. discloses an apparatus for spraying a coating onto the outside of a pipe includes a body for mounting on a pipe to be coated. A spray gun is mounted on the body such that it can move relative to the body to spray coating completely around the periphery of the pipe. The spray gun includes a nozzle with a rotating tip and an actuator for rotating the tip, the tip being rotatable between a first position producing a fan-shaped spray, and a second position producing a jet spray. Preferably there is only one spray gun, the coating applied completely around the periphery of a pipe using only one spray gun, the body of the apparatus remaining rotationally fixed relative to the axis of the pipe. The spray gun may be movably, especially pivotally, mounted on the ring so that it may be moved, especially turned, to spray away from the surface of a pipe, for example through 90° to spray tangentially to the pipe. Daykin does not disclose a method or apparatus for spraying away from the surface of a pipe for reversing and feathering and does not disclose a method or apparatus for use of more than one spray guns capable of coordinated flipping in both clockwise and counterclockwise directions.

U.S. Pat. No. 7,066,186 to Barr discloses a method and apparatus mounted on a painting system to clean a paint feed line by forcing a solvent and an inert gas, nitrogen, through the feed line at the end of a cleaning stage, the gas remaining in the feed line until the next operational stage begins. Bahr discloses a system for single component coating materials or coating materials that have been pre-mixed and have a long pot life. It is not clear whether the system works with plural component coatings with a rapid cure time and a pot life that is measured in seconds. A solvent is used prior to injection, at relatively low pressure, of an inert gas. Since there is no mixing manifold, cleaning of a mixing manifold or static mixing tubes is not disclosed.

U.S. Pat. No. 6,227,228 to Fullenbach discloses a purge process for sequential plural component mixing system, alternately injecting water and air at intervals into the mix chamber through purge valves to purge the mixed material. Fullenbach's disclosure appears to be limited to hydro-softfeel lacquers and not with epoxy and urethane coatings. Further, a combination of air and water is used to flush one side of a mixing manifold, use of inert gas only is not disclosed.

German Pat. DE 4134598 to Blochmann, et al. discloses a method of cleaning a viscous material mixer by directing a blast of compressed air through a mixer and then a blast of a mixture of air and solvent. Blochman discloses blasting at high pressure, a single pressure purge. Blochman does not disclose performing a high pressure followed by a low pressure purge.

Plural component coating systems such as Polyurethane and Epoxy coatings consist of two components that are mixed together at a specific ratio and applied using airless hot-spray equipment. Often these coatings are solvent free, consisting of 100 percent solids.

The two-components, referred to as component A and component B are stored in separate containers and have an extended shelf life.

Once component A and component B are mixed together in the prescribed ratio, a chemical reaction begins to occur that will ultimately cause the material to adhere to the substrate, harden and become the desired corrosion barrier. This is a "curing" process as opposed to a "drying" process brought about by the evaporation of solvents or water contained in the coating. This curing is not instantaneous but occurs over time and passes through several stages.

A first identifiable point is referred to as "pot life", or the amount of time after mixing before the material begins to cure. This is often only a matter of seconds in the case of polyurethane and epoxy coatings. The second point is "touch dry" where the coating appears dry to the touch but can still be easily damaged by handling or placing objects on the coated surface. The third point is "stackable". When the coating reaches this condition it can be handled easily and is not subject to damage when other similar items are stacked on top of it. The final point is "fully cured" and is the point where no further chemical reaction will occur.

The rate the coating passes through the various points depends on many variables, some of which are: a) the type of coating, polyurethane coatings cure more rapidly than epoxy coatings; b) the chemical composition of component A and B, coatings can be chemically designed to cure more rapidly or slowly; and c) the ambient temperature, the higher the temperature the faster the curing reaction occurs. The curing of the coating material creates problems for airless hot-spray application.

In one example, a drum of Component A, which is typically pasty at ambient temperature, is heated by an electric heater (bottom plate or drum belt) to about 50° C. At this temperature the viscosity of component A significantly decreases and becomes similar to that of component B. Component B, typically liquid at ambient temperature, usually requires no extra heating prior to pumping into the device. Both components are transported from the drums to the high pressure dosing or proportioning pumps by individual material feed pumps and material hoses. In general, the feed pumps are pneumatically operated piston pumps.

The high pressure dosing pumps are an important element of the spraying device. There are different systems which are mainly based on combinations of pumps with different volumes or pumps with different stroke length and/or stroke speed. In some examples, the dosing pumps pressurize the material to an operational spraying pressure of at least 3000 psi. In separate lines and in exact proportions of mixing ratio, the two components are pushed through the high pressure fluid heaters and gauge to a mixing block.

Depending on the kind of employment of the device, on the required length of the hose package (separate hoses for component A and B) and on the pot life of the material to be sprayed, the mixing block is mounted on the frame of the proportioning unit or is located separately. The mixing block can include manually or pneumatically controlled valves to open and close or to bypass the fluid lines. In case the mixing block is placed beyond a certain distance from the machine, the hose package is heated (electrically, by hot water, etc.). In the mixing block, the two components are mixed by a static mixer. The chemically reacting two component blend then passes through a high pressure hose. Various types of manually or mechanically controlled spray guns can be connected to the dispensing hose.

The rapid curing of the coating material requires that the mixed material be purged out of the system each time the equipment stops. Otherwise, the coating material will set up in the lines and spray tips. If the coating material sets up in the system then extensive and time consuming repairs have to be made before work can restart.

Continuing with the example, the mixing block also has a flushing system to pump out the mixed material when spraying has to be temporarily interrupted or stopped. A powerful solvent flushing or purging pump is activated when the system is set to 'flushing mode' and the spray gun trigger is pressed. The mixed material is forced out by the solvent, which also flushes and rinses all system components, which were in contact with the processed material, such as the static mixer, the high-pressure hose and the spray gun. This flushing process is intended to prevent blocking of the device by cured material.

Nature of the Problem

Automated airless hot-spray systems usually require frequent starting and stopping of the coating application. One problem is that most purge systems use solvents, especially in the case of coatings that are plural or multi-component coating mixtures. Plural component coating mixtures typically begin curing upon mixing. Cleaning out the plural component mix typically requires a solvent to effect clearing and cleaning of the mix from the mixing and delivery apparatus. Each time the application of the coating must be stopped, the system is flushed with solvent, typically as described above, to prevent the coating material from curing up in the lines containing the mixed materials. During the flushing operation, there is now a combination of mixed material and solvent coming out of the spray tip. This combination of coating material and solvent cannot be allowed to go onto the properly coated surface of the work piece. If this were to happen, all contaminated coating would have to be removed from the surface, an expensive and time consuming task.

This also presents the problem that the lines are full of solvent after flushing. When the spray is restarted, the first material out of the lines is a mixture of solvent and coating material. This must not be allowed to come in contact with the surface of the work piece to be coated, as it would cause a defect in the coating.

Additionally, the use of solvents in field spraying operations can be very difficult for environmental reasons. Proper precautions must be taken to contain any solvent used in the flushing operation. Any solvent that escapes into the environment must be cleaned up As noted, gas purge systems have been attempted, but result in causing a foam to develop on the coating. Using an inert gas delivered at a high pressure for purging, without more, results in an adiabatic expansion of the gas as it exits the spray tip. This can cause the ambient temperature in the vicinity of the spray tip to drop below the dew point, resulting in water being deposited on the coating material. Again, depositing water onto the surface of the work piece or the fresh coating will lead to damage of the coating at those locations.

Another problem occurs in the first three to four seconds of initial spray (of delivery of the coating mixture from the delivery apparatus or to the work piece) is not good, resulting in a bad buildup on the work piece. One reason this occurs is that the plural component mix and/or spray pattern has not yet stabilized. One manual solution is to tip the delivery apparatus, the spray gun, away from the work piece during spray pattern startup. For a cylindrical object, such as a pipeline pipe, tipping away may require either an inward movement or an outward movement of the spray gun, depending on the location of the spray gun relative to the work piece, the effect of gravity, and the portions of the work piece that are already coated. For example, tipping inward at one location will place the spray from the spray gun onto a previously coated portion of the work piece while tipping outward at another location will also place the spray from the spray gun onto a previously coated portion of the work piece. Having multiple spray guns working together creates a combination of inward and outward tipping requirements.

For two spray guns, one starting at a "12-o'clock" position and another starting at the "6-o'clock" position, a problem of coating buildup occurs during ramp-up and ramp-down of the spray, resulting in uneven coating thickness and buildup at the "6-o'clock" and "12-o'clock" positions. One solution is to pull the spray gun away at the "6-o'clock" and "12-o'clock" positions when the oscillations need to reverse direction. "Flipping" the gun off the workpiece is one such approach. Such a solution is not so simple or obvious to achieve. Simply pulling the spray gun away results in waste of expensive coating material. Turning the spray guns on and off repeatedly results in clogging due to internal particulate buildup of the curing coating mix. Purging with commonly used solvents results in deposit of solvents to the environment surrounding the work piece and also damages the coating on the work piece.

A major problem in joint coating is the loss in coating material due to overspray. Typically, about twice as much coating material is used over the theoretically required amount. It is not unusual for twenty-five percent (25%) of the cost of a rehabilitation job to be in the cost of the coating material. It is not easily determined when too much coating thickness has been applied, yet having too thin of a coating thickness in spots then requires re-spraying. Further, there is much waste spray from spraying off target, away from the work piece.

Simply flipping the spray away from the workpiece still does not obviously insure that a uniform coating thickness is being applied and that overspray is being minimized. Further, there is not any way to reconfirm the amount of coating applied except by careful and exhaustive inspection of the workpiece after the work is finished. There is not a way to validate the success of the coating operation during spray so as to be able to adaptively adjust the spraying parameters to maintain uniform coating and to minimize overspray.

Another problem that affects the quality and the uniformity of a plural component coating is caused by variations in the proportioning of the plural components A & B. The proportion of component A to component B, for example, will form an improper coating if the proportion is not maintained within a five percent (5%) tolerance. For example, an out-of-proportion excess of one component over the other component will result in a failure of the coating mix or blend to cure. When sprayed on the work piece, the failure to cure the coating blend properly will result in an unacceptable coating that must be cleaned and re-sprayed.

In current practice, constant inspection of the coating quality is done manually; as well as performing after-the-fact adjustments to the mix proportion and spray rates in order to attempt to regain a proper coating quality and coating thickness. A number of persons are required on the job site of a pipeline rehabilitation for manual inspection and intervention due to these problems with control of coating thickness, over or under spray, component proportioning, and purging. These manual operations require more persons on the job site, which is very expensive, as well as a high degree of skill and art to timely and effectively make the adjustments. These additional workers increase the safety risks around a pipeline job site and add significant additional costs to the rehabilitation work. The process requires constant attention. Even with one skilled in the art of observing the coating, operating and adjusting of the coating parameters, the operation does not result in a desired uniformity of coating at a proper thickness. There is still significant waste in coating mix.

The applicant has identified an interdependence between several problems in pipeline coating application systems. Coating thickness and quality are dependent upon better control of the application of the coating material, including better control of the proportioning of the coating components, as well as better control of the spray during starts and stops in application and also better control of the spray during purging.

BRIEF SUMMARY OF THE INVENTION

In a first set of examples, a method for coating a non-rotating pipe work piece is disclosed, the coating method including: flowing a first component material and a second component material; measuring at least one parameter of the flow of at least one component material; mixing the component materials; applying the mixed component materials to the outside surface of the work piece in an arc-like trajectory about the axis of the work piece, where the applying includes oscillating at least two spray guns applying the mixed component materials about the work piece and traversing the at least two spray guns along an axial direction of the work piece; adjusting the frequency of oscillation of the at least two spray guns based at least in part on at least one parameter of the flow of the components and based at least in part on a selected coating thickness and based at least in part on a selected spray width and based at least in part on the outer diameter of the work piece; and adjusting the speed of traversing the at least two spray guns along an axial direction of the work piece based at least in part on the oscillation frequency and based at least in part on the selected spray width.

In another example, the method further includes verifying the ratio of the flow of the two components. In a further example, the method includes stopping application of the mixed component materials to the outside surface of the work piece based on the ratio of the flow of the two components.

In another example, the step of adjusting the oscillation frequency is further based at least in part on allowance for overspray.

In another example, the step of adjusting the oscillation frequency is further based at least in part on a selected number of rotational degrees.

In another example, the step of adjusting the oscillation frequency is further based at least in part on a selected number of passes.

In another example, a method for coating a non-rotating pipe work piece is disclosed, the method including: spraying a coating about the outside surface of the work piece along an oscillating arc-like path; reversing the direction of the arc-like path of the spray; rotating the spray away from the work piece when reversing the direction of the arc-like path of the spray; and where the rotation of the spray away from the work piece is in the direction of the arc-like path prior to reversing direction.

In another example, the step of spraying a coating further includes at least two spray patterns disposed at opposing locations about the outside surface of the work piece, the at least two spray patterns oscillating in unison along the arc-like path, and each spray pattern rotated away from the work piece when reversing the direction of the arc-like path of the spray, the rotation in the direction of the arc-like path prior to reversing direction.

In another example, a method for purging a plural component coating application system is disclosed, the method including: injecting inert gas into a mixing manifold of the coating application system at a first pressure sufficient to maintain the atomization pressure of a coating spray pattern; injecting the inert gas at reduced pressure following the first pressure; and ejecting mixed coating material and the inert gas from the system. In another example, the reduced pressure is less than one-fifth of the first pressure.

In another example, the injection of inert gas at a first pressure occurs for less than one second.

In a second set of examples, an apparatus for coating a non-rotating pipe work piece is disclosed, the apparatus including: a means for flowing a first component material and a second component material; a means for measuring at least one parameter of the flow of at least one of the component materials; a means for mixing the component materials; a means for applying the mixed component materials to the outside surface of the work piece in an arc-like trajectory about the axis of the work piece, wherein the means for applying comprises oscillating at least two spray guns applying the mixed component materials about the work piece and traversing the at least two spray guns along an axial direction of the work piece; a means for adjusting the frequency of oscillation of the at least two spray guns based at least in part on at least one parameter of the flow of the components and based at least in part on a selected coating thickness and based at least in part on a selected spray pattern width and based at least in part on the outer diameter of the work piece; and a means for adjusting the speed of traversing the at least two spray guns along an axial direction of the work piece based at least in part on the oscillation frequency and based at least in part on the selected spray pattern width.

In another example, the apparatus further includes a means for verifying the ratio of the flow of the two components. In a further example, the apparatus further includes a means for stopping application of the mixed component materials to the outside surface of the work piece based on the ratio of the flow of the two components.

In another example, the means for adjusting the oscillation frequency is based at least in part on allowance for overspray.

In another example, the means for adjusting the oscillation frequency is further based at least in part on a selected number of rotational degrees.

In another example, the means for adjusting the oscillation frequency is further based at least in part on a selected number of passes.

In another example, an apparatus for coating a non-rotating pipe work piece is disclosed, the apparatus including: a means for spraying a coating about the outside surface of the work piece along an oscillating arc-like path; a means for reversing the direction of the arc-like path of the spray; a means for rotating the spray away from the work piece when reversing the direction of the arc-like path of the spray; and where the rotation of the spray away from the work piece is in the direction of the arc-like path prior to reversing direction.

In another example, the means for spraying a coating further includes at least two means for spraying disposed at opposing locations about the outside surface of the work piece, the at least two means for spraying having means for oscillating in unison along the arc-like path, and each means for spraying having means for rotating away from the work piece when reversing the direction of the arc-like path of the spray, the rotation in the direction of the arc-like path prior to reversing direction.

In another example, an apparatus for purging a plural component coating application system is disclosed, the apparatus including: a means for injecting inert gas into a mixing manifold of the coating application system at a first pressure sufficient to maintain the atomization pressure of a coating spray pattern; a means for injecting the inert gas at reduced pressure following the first pressure; and a means for ejecting mixed coating material and the inert gas from the system. In another example, the reduced pressure is less than one-fifth of the first pressure.

In another example, the means for injection of inert gas at a first pressure incorporates means for injecting for less than one second.

In one example, the means for flowing a first component material and a second component material includes: a first valve for receiving a first component material delivered at a pressure; a first flow line connected from the first valve for delivering the first component material to a mixing block; a second valve for receiving a second component material delivered at a pressure; and a second flow line connected from the second valve for delivering the second component material to a mixing block.

In one example, the means for measuring at least one parameter of the flow of each component material includes: a first flow measurement device in communication with the first flow line to measure the flow of the first component; and a second flow measurement device in communication with the second flow line to measure the flow of the second component.

In one example, the means for mixing the component materials includes: a mixing block in fluid communication with the first flow line and the second flow line for receiving the first component material and the second component material; and a static mixer in fluid communication with the mixing block for receiving the combined first and second components.

In one example, the means for applying the mixed component materials to the outside surface of the work piece in an arc-like trajectory about the axis of the work piece includes: a C-shaped plate member capable of being positioned and arranged around the outside surface of the work piece; a first drive mechanism attached to the C-shaped member positioned and arranged to oscillate a partial rotation of the C-shaped member about the work piece where the rate of oscillation of the first drive mechanism is capable of being controlled by a logic controller; and at least two spray guns disposed on the C-shaped member positioned and arranged to spray towards the outside surface of the work piece, the at least two spray guns in fluid communication with the static mixer.

In one example, the means for applying further includes a roller member capable of being positioned and arranged onto the work piece; and a second drive mechanism connected to the roller member positioned and arranged to traverse the at least two spray guns longitudinally along an axial direction of the work piece where the rate of traverse of the second drive mechanism is capable of being controlled by a logic controller.

In one example, the means for adjusting the frequency of oscillation includes: one or more logic controllers programmed: to receive at least one parameter from at least one of the first or the second flow measurement device and programmed to receive a selected coating thickness and programmed to receive at least one parameter related to the spray pattern width and programmed to receive at least one parameter related to the outer diameter of the work piece and further programmed to control the rate of oscillation of the first drive mechanism based at least in part on at least one parameter from at least one of the first or the second flow measurement device and based at least in part on the selected coating thickness and based at least in part on at least one parameter related to the spray pattern width and based at least in part on the at least one parameter related to the outer diameter of the work piece.

In one example, the means for adjusting the speed of traversing includes one or more logic controllers programmed: to control the speed of traversal of the second drive mechanism based at least in part on the rate of oscillation of the first drive mechanism and based at least in part on at least one parameter related to the spray pattern width.

In one example, the means for verifying the ratio of the flow of the two components includes one or more logic controllers programmed to verify the ratio of the flows of the two components.

In one example, the means for stopping application of the mixed component materials includes one or more logic controllers programmed to actuate one or more valves to stop spray of the mixed component materials based on the ratio of the flows of the two components.

In one example, the means for adjusting the oscillation frequency includes one or more logic controllers programmed to control the rate of oscillation of the first drive mechanism based at least in part on a received parameter to allow for overspray.

In one example, the means for spraying a coating about the outside surface of the work piece along an oscillating arc-like path includes: a C-shaped plate member capable of being positioned and arranged around the outside surface of the work piece; a first drive mechanism attached to the C-shaped member positioned and arranged to oscillate a partial rotation of the C-shaped member about the work piece where the rate of oscillation of the first drive mechanism is capable of being controlled by a logic controller; and at least two spray gun assemblies disposed on the C-shaped member comprising spray guns positioned and arranged to spray towards the outside surface of the work piece, the at least two spray guns configured to receive a coating material for spraying.

In one example, the means for reversing the direction of the arc-like path of the spray includes one or more logic controllers programmed to control the rate of oscillation of the first drive mechanism.

In one example, the means for rotating the spray away from the work piece when reversing the direction of the arc-like path of the spray include spray gun assemblies including a split-hinge mount having two opposing actuation members configured and arranged to rotate the spray gun about an axis of the spray gun assembly upon actuation of either actuation member.

In one example, the means for rotation of the spray away from the work piece is in the direction of the arc-like path prior to reversing direction include: one or more logic controllers are programmed to actuate the actuating members of the spray gun assembly to rotate the spray pattern from the spray guns away from the work piece in the direction of the arc-like path that existed prior to reversing direction.

In one example, the means for injecting inert gas into a mixing manifold of the coating application system at a first pressure sufficient to maintain the atomization pressure of a coating spray pattern includes: a first pressure regulator for receiving an inert gas, providing the inert gas at a first pressure, the first pressure sufficient to maintain the atomization pressure of a coating spray pattern; a first valve in fluid communication between the upstream side of the first valve and the regulated side of the first pressure regulator; a first operator connected to the first valve capable of being controlled by a logic controller and operable to open and close the first valve; a first check valve in fluid communication between the upstream side of the first check valve and the downstream side of the first valve; and a mixing manifold in fluid communication with the downstream side of the first check valve.

In one example, the means for injecting the inert gas at reduced pressure following the first pressure include: a second pressure regulator for receiving an inert gas, providing the inert gas at a second pressure that is less than the first pressure; a second valve in fluid communication between the upstream side of the second valve and the regulated side of the second pressure regulator; a second operator connected to the first valve capable of being controlled by a logic controller and operable to open and close the second valve; a second check valve in fluid communication between the upstream side of the second check valve and the downstream side of the second valve; where the mixing manifold is in at least one way fluid communication with the downstream side of the second check valve.

In one example, the means for ejecting mixed coating material and the inert gas from the system includes: a static mixer in fluid communication with the mixing manifold; and an outlet from the static mixer for receiving a connection to at least two spraying members.

In one example, the means for injection of inert gas at a first pressure incorporates means for injecting for less than one second includes: a logic controller in logical communication with the first operator, the logic controller programmed to enable opening and closing of the first valve within one second.

In third set of examples, a system for coating a non-rotating pipe work piece is disclosed, the system including: a first valve for receiving a first component material delivered at a pressure; a first flow line connected from the first valve for delivering the first component material to a mixing block; a second valve for receiving a second component material delivered at a pressure; a second flow line connected from the second valve for delivering the second component material to a mixing block; a first flow measurement device in communication with the first flow line to measure the flow of the first component; a second flow measurement device in communication with the second flow line to measure the flow of the second component; a mixing block in fluid communication with the first flow line and the second flow line for receiving the first component material and the second component material; a static mixer in fluid communication with the mixing block for receiving the combined first and second components; a C-shaped plate member capable of being positioned and arranged around the outside surface of the work piece; a first drive mechanism attached to the C-shaped member positioned and arranged to oscillate a partial rotation of the C-shaped member about the work piece wherein the rate of oscillation of the first drive mechanism is capable of being controlled by a logic controller; at least two spray guns disposed on the C-shaped member positioned and arranged to spray towards the outside surface of the work piece, the at least two spray guns in fluid communication with the static mixer; a roller member capable of being positioned and arranged onto the work piece; a second drive mechanism connected to the roller member positioned and arranged to traverse the at least two spray guns longitudinally along an axial direction of the work piece wherein the rate of traverse of the second drive mechanism is capable of being controlled by a logic controller; and one or more logic controllers programmed: to receive at least one parameter from at least one of the first or the second flow measurement device and programmed to receive a selected coating thickness and programmed to receive at least one parameter related to the spray pattern width and programmed to receive at least one parameter related to the outer diameter of the work piece and further programmed to control the rate of oscillation of the first drive mechanism based at least in part on at least one parameter from at least one of the first or the second flow measurement device and based at least in part on the selected coating thickness and based at least in part on at least one parameter related to the spray pattern width and based at least in part on the at least one parameter related to the outer diameter of the work piece; and to control the speed of traversal of the second drive mechanism based at least in part on the rate of oscillation of the first drive mechanism and based at least in part on at least one parameter related to the spray pattern width.

In one example, the one or more logic controllers are programmed to verify the ratio of the flows of the two components.

In one example, the one or more logic controllers are programmed to actuate one or more valves to stop spray of the mixed component materials based on the ratio of the flows of the two components.

In one example, the one or more logic controllers are programmed to control the rate of oscillation of the first drive mechanism is further based at least in part on a received parameter to allow for overspray.

In one example, the one or more logic controllers are programmed to control the rate of oscillation of the first drive mechanism is further based at least in part on a selected number of rotational degrees.

In one example, the one or more logic controllers are programmed to control the rate of oscillation of the first drive mechanism is further based at least in part on a selected number of passes.

In one example, a system for coating a non-rotating pipe work piece is disclosed, the system including: a C-shaped plate member capable of being positioned and arranged around the outside surface of the work piece; a first drive mechanism attached to the C-shaped member positioned and arranged to oscillate a partial rotation of the C-shaped member about the work piece wherein the rate of oscillation of the first drive mechanism is capable of being controlled by a logic controller; at least two spray gun assemblies disposed on the C-shaped member comprising spray guns positioned and arranged to spray towards the outside surface of the work piece, the at least two spray guns configured to receive a coating material for spraying; one or more logic controllers programmed to control the rate of oscillation of the first drive mechanism; where the spray gun assemblies comprise a split-hinge mount having two opposing actuation members configured and arranged to rotate the spray gun about an axis of the spray gun assembly upon actuation of either actuation member; and where the one or more logic controllers are programmed to actuate the actuating members of the spray gun assembly to rotate the spray pattern from the spray guns away from the work piece in the direction of the arc-like path that existed prior to reversing direction.

In one example, a system for purging a plural component coating application system is disclosed, the system including: a first pressure regulator for receiving an inert gas, providing the inert gas at a first pressure, the first pressure sufficient to maintain the atomization pressure of a coating spray pattern; a first valve in fluid communication between the upstream side of the first valve and the regulated side of the first pressure regulator; a first operator connected to the first valve capable of being controlled by a logic controller and operable to open and close the first valve; a first check valve in fluid communication between the upstream side of the first check valve and the downstream side of the first valve; a mixing manifold in fluid communication with the downstream side of the first check valve; a second pressure regulator for receiving an inert gas, providing the inert gas at a second pressure that is less than the first pressure; a second valve in fluid communication between the upstream side of the second valve and the regulated side of the second pressure regulator; a second operator connected to the first valve capable of being controlled by a logic controller and operable to open and close the second valve; a second check valve in fluid communication between the upstream side of the second check valve and the downstream side of the second valve; where the mixing manifold is in at least one way fluid communication with the downstream side of the second check valve; a static mixer in fluid communication with the mixing manifold; an outlet from the static mixer for receiving a connection to at least two spraying members; and where the second regulator is capable of providing the second pressure of the inert gas at a second pressure that is less than one-fifth of the first pressure.

In one example, the system further includes a logic controller in logical communication with the first operator, the logic controller programmed to enable opening and closing of the first valve within one second.

BRIEF DESCRIPTION OF THE SEVERAL VIEWS OF THE DRAWINGS

The present invention is best understood with reference to the attached drawings in which like numerals refer to like elements, and in which.

DETAILED DESCRIPTION OF THE INVENTION

Figure 1:
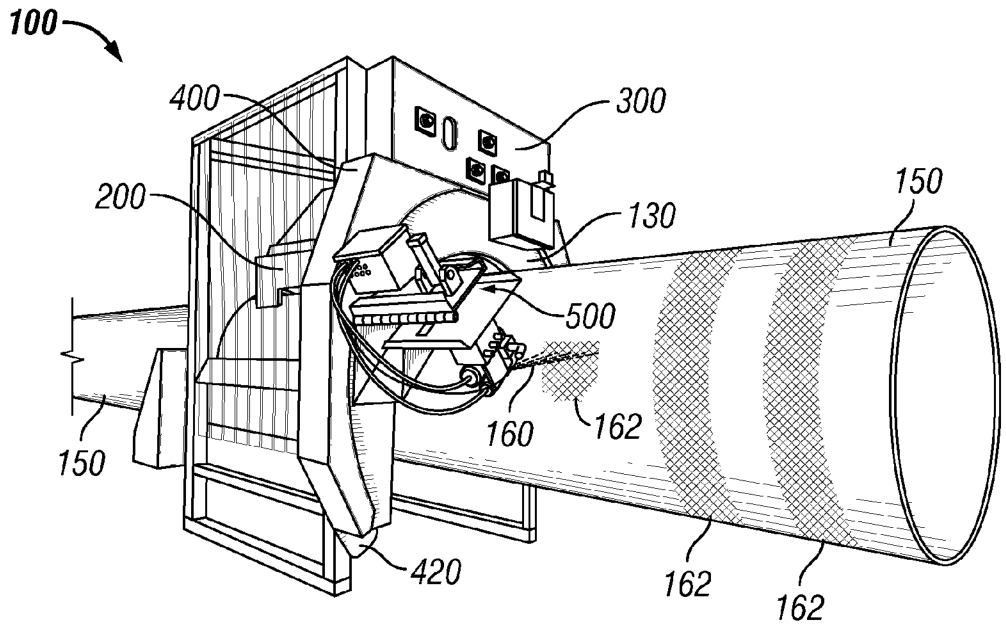
FIG. 1 illustrates a 3-D perspective view of the far side of a line travel coating system 100 spraying a coating 162 on a pipe work piece 150.

In one example providing an overview, a plural component coating system is employed for pipeline pipe coating application. In this example, polyurethane or epoxy coatings are employed, which is made up of two components that are mixed together at a specific ratio and applied using airless hot-spray equipment. In one example, the coating material is solvent free, consisting of 100 percent solids. A line travel coating system is employed that provides rapid line travel to apply the coating along the pipe work piece of the pipeline. In one example, two oscillating airless spray guns apply the coating at a fixed stand-off from the pipe. Variable oscillation and line travel speeds insure uniform coating at the desired thickness.

Flow meters are used to measure the amount of flow of each of individual components A and B. These flow meters are used to monitor or measure the metering ratio of the proportion of components A and B to determine if the proportioning is within tolerance, for example, if within five percent (5%). One example of a cause for drift out of tolerance is that of wear of one dosing or proportioning pump over the other proportioning pump. In another example, plugging of one of the component lines causes the ratio of the components to fall out of tolerance. The plural component mix will fail to properly cure if the proportion of the components A and B are out of tolerance. The flow meters help identify which side of the pumps (A or B) is causing the problem. This results in reduced maintenance costs. Further, the flow meters are able to measure the amount of plural component mix that is sprayed on the work piece (the pipe) and this amount relates to the desired coating thickness. Using the flow meter measurements, along with other parameters, a desired rate of oscillation of the spray guns is calculated.

The flow meter measurements are thus tied to the oscillation rate of the spray guns. In one example, this is done by using a variable frequency drive. In one example, a Siemens variable frequency drive is used. Through the use of a program logic controller, the measured flow rate is used in combination with information based on the desired coating thickness, the spray width pattern, and the diameter of the pipe to dictate the oscillation speed of the spray guns. The oscillation speed of the spray guns in turn is conceptually used to dictate the line travel speed along the longitudinal length of the work piece (the pipe).

Program logic is used to create an adaptive system based on the input parameters of flow rate, desired coating thickness, and the diameter of the work piece, the spray width, as well as oscillation frequency and line travel speed. The spray gun oscillation speed and line travel speed are thus adapted automatically to maintain a uniform coating. Previously, adjustments to oscillation speed and line travel speed had to be performed manually and required constant attention. Since the measurements and resulting changes in application are being performed through an adaptive system, in one example, it is possible and desirable to also record the data for audit purposes and post-inspection. This enables creation of documentation and reporting to demonstrate that a proper application of the coating was performed and also identifies any locations where additional inspection and confirmation are warranted.

Now that an adaptive system is controlling the application of the plural component coating, it becomes practical to introduce an automated mechanism to solve the coating build-up problem that occurs in the "6-o'clock" and "12-o'clock" positions where the oscillations need to reverse direction. One problem with simply "flipping" the spray gun away is that each gun must be capable of flipping counter-clockwise away in one instance during the cycle, but also must be capable of flipping clockwise away at another instance during the cycle.

In one example, the flip mechanism for the spray gun needs to be responsive. In one example, air return is used instead of spring return for both the flipping mechanism and the opening and closing of the spray guns. The flip mechanism has a goal to have less than one tenth of one second (1/10 sec) response time. In one example, short and small air lines are used to minimize the response time.

As previously described, in one example, each gun is capable of both clockwise and counterclockwise rotation. In one example, this is achieved by having one actuation cylinder positioned and arranged to force motion in the clockwise direction and having a second actuation cylinder positioned and arranged to force motion in the counterclockwise direction. In one example, this is accomplished by using a split hinge where one hinge leaf holds the spray gun and the other hinge leaf is split into two independent leaves that are longitudinally adjacent to each other along the axis of rotation of the hinge. One of the split leaves holds a first actuation cylinder capable of applying force in one rotational direction (for example, clockwise) and the other of the split leaves holds a second actuation cylinder capable of applying force in the opposite rotational direction (for example, counterclockwise). In this example, the spray gun is rendered capable of both clockwise and counterclockwise rotation with short response times owing to the fast response of the two pneumatic actuation cylinders.

The fast response of the flip system, combined with the adaptive system for controlling spray oscillation speed and line travel speed (and, therefore control of coating thickness), enables uniform or controlled coating thickness even at the reverse points of the spray guns where traditionally a coating build-up problem occurs in the "6-o'clock" and "12-o'clock" positions where the oscillations need to reverse direction.

Now that an adaptive system is controlling the application of the plural component coating, and the spray guns are controlled at the reverse points, it becomes practical to introduce a purging method and system that reduces the need for solvents of environmental concern.

Using an argon gas instead of solvents enables constant pressure so that the spray pattern is not disrupted. However, the high pressure argon has a cooling effect, caused by adiabatic expansion, which causes other problems, namely condensation or creation of moisture on the coated surface of the work piece (the pipe). The condensation damages the coating on the work piece. For example, if the coating material is a poly urethane, then the poly urethane mixed with the condensate water will create foam that ruins the coated surface. This new problem is solved by clearing or purging, in one example, with a 2500 psi blast of argon that is then followed by a low pressure purge of argon of approximately 100 psi. This technique reduces the moisture problem. In one example, the high pressure purge is approximately two tenths of a second (2/10 sec), followed by the low pressure purge of five to twenty seconds (5-20 sec). In one example, the spray guns flip off target at the time of the low pressure purge, avoiding damage to the newly coated surface. In one example, the purge time is adjustable based on the amount of humidity present. A short purge time prevents condensation yet still achieves the goal of clearing or purging the system.

In another example, a 4000 psi argon tank is used for purging and clearing operations. The 4000 psi argon tank is regulated down to 2500 psi. Such tanks are readily available as they are used in welding work. Once the tank reaches 2500 psi, the tank is replaced. The 2500 psi argon tank is still usable for welding purposes and returned for use in welding. Therefore, the partially expended 2500 psi tank of argon is not wasted.

An advantage to using argon is that no solvent is deposited to the environment. Only additional coating material is sputtered, which is the same material that is already being put onto the work piece (the pipe) and is already being deposited into the ground, into the environment.

Thus, in one example, the multi-stage method for clearing or purging is to provide a 2500 psi high pressure argon gas purge of a fraction of a second, followed by quickly moving the spray guns away from the work piece (the "flip"), followed by a low pressure 100 psi argon gas purge of five to twenty seconds.

FIG. 1 illustrates a 3-D perspective view of the far side of a line travel coating system 100 spraying a coating 162 on a pipe work piece 150. The line travel coating system 100 is configured and arranged about a work piece, in this example a pipe 150. A line travel drive module 200, positioned in the line travel system housing, physically moves the system along the longitudinal axis of the work piece 150. An oscillating ring assembly 400 is attached to one side of the housing, configured and arranged about the axis of the work piece. An oscillation drive mechanism 300 is attached above the oscillating ring assembly 400. The oscillation drive mechanism 300 controls and mechanically rotates the oscillating ring assembly 400 about the axis of the work piece 150 in an arcuate or arc-like path. At least two spray gun flip assemblies 500 are attached to the oscillating ring assembly 400. In a preferred example, two spray gun flip assemblies 500 are attached on either side of the oscillating ring assembly 400. Spray guns on the gun flip assemblies 500 spray 160 coating material 162 onto the work piece 150. The gun flip assemblies 500 are capable of rotating the spray guns toward and away from the work piece 150. In one example, the gun flip assemblies 500 position the spray 160 approximately perpendicular to the surface of the work piece 150 when in the home position. The gun flip assemblies 500 are capable of rotating the spray 160 either clockwise away from home position or counter-clockwise from home position.

Figure 2:
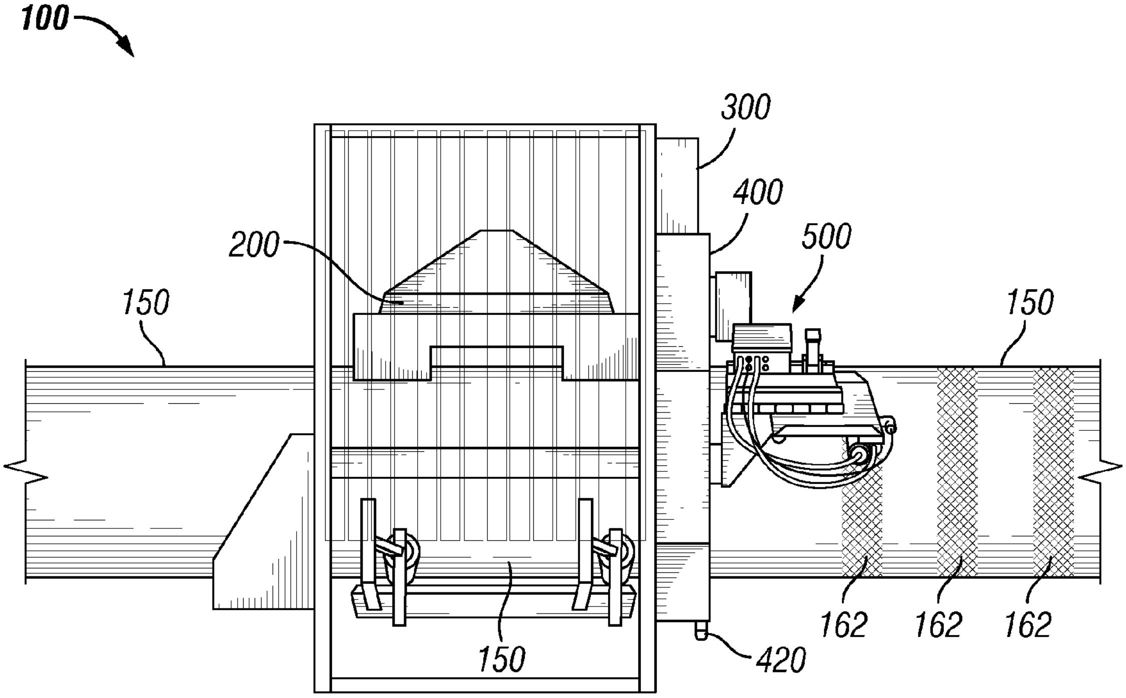
FIG. 2 illustrates a view of the far side of a line travel coating system.

FIG. 2 illustrates a view of the far side of a line travel coating system 100. The line travel coating system 100 is configured and arranged about a work piece, in this example a pipe 150. A line travel drive module 200, positioned in the line travel system housing and disposed on top of the work piece 150, physically moves the system 100 along the longitudinal axis of the work piece 150. The oscillating ring assembly 400, shown in side view, is attached to the right of the line travel housing, positioned over and about the work piece 150. The oscillation drive mechanism 300 is attached above the oscillating ring assembly 400. At least two spray gun flip assemblies 500 are attached to the rings of the oscillating ring assembly 400, offset to the right of the oscillating ring assembly 400. Spray guns on the gun flip assemblies 500 spray coating material 162 unto the work piece 150. A coating material mixing manifold and purge valves are on the opposite side of the line travel coating system and are not visible in this view.

Figure 3:
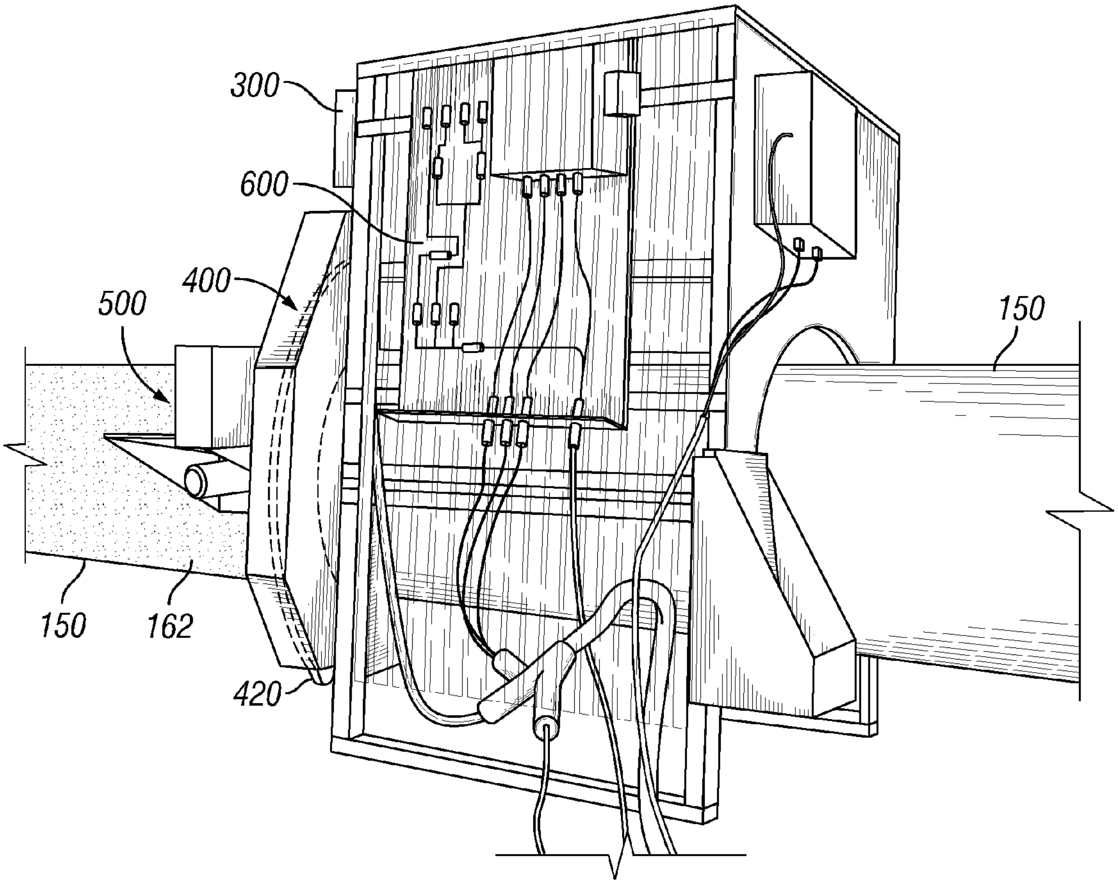
FIG. 3 illustrates a view of the near side of a line travel coating system.

FIG. 3 illustrates a view of the near side of a line travel coating system 100. The line travel coating system 100 is configured and arranged about a work piece, in this example a pipe 150. A line travel drive module, positioned in the line travel system housing and disposed on top of the work piece, is on the opposite side of the line travel coating system and is not visible in this view. The oscillating ring assembly 400, shown in side view, is attached to the left of the line travel housing, positioned over and about the work piece 150. The oscillation drive mechanism 300 is attached above the oscillating ring assembly 400. At least two spray gun flip assemblies 500 are attached to the rings of the oscillating ring assembly 400, offset to the left of the oscillating ring assembly 400. Spray guns on the gun flip assemblies 500 spray coating material 162 unto the work piece 150. A coating material mixing manifold with purge valves and associated plumbing, purge system 600, are disposed in the line travel system housing and are visible from this view.

Figure 5:
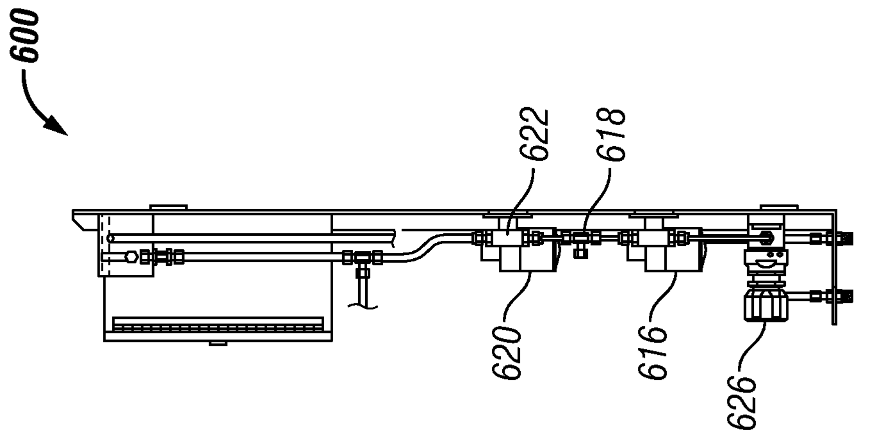
FIG. 5 illustrates a diagrammatic side view of the purge system 600 physical layout.
Figure 4:
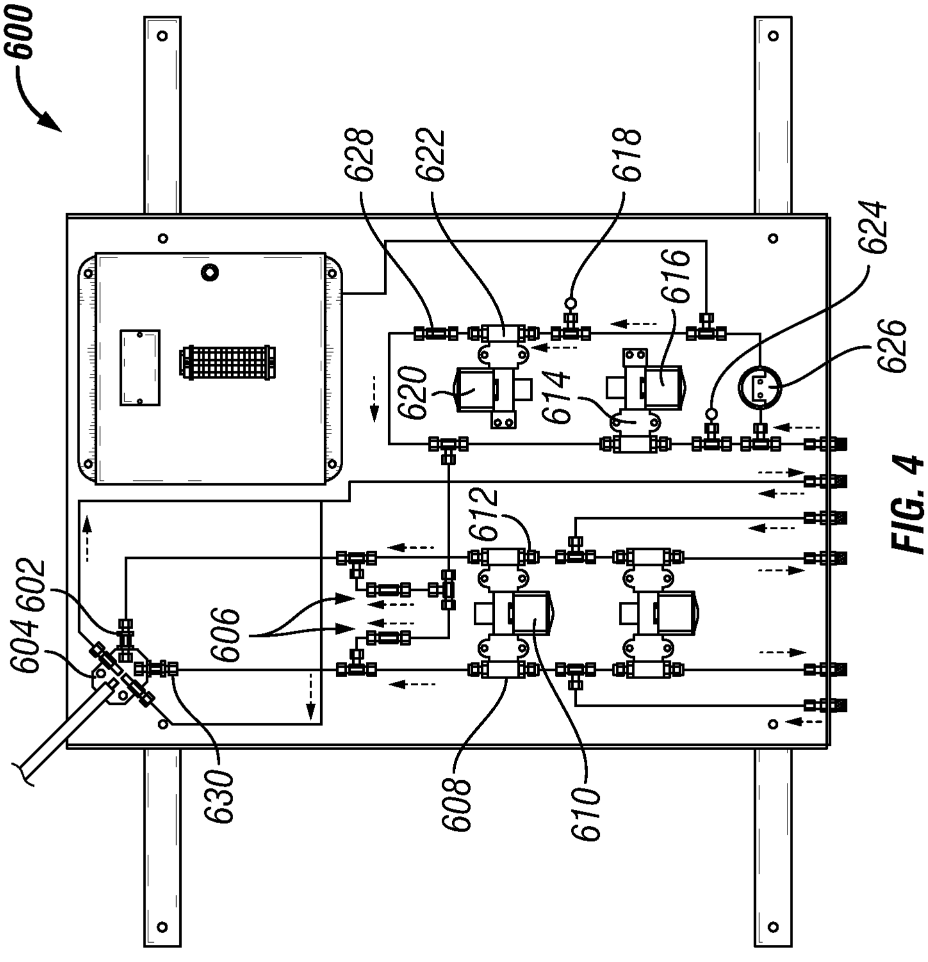
FIG. 4 illustrates a diagrammatic front view of the purge system 600 physical layout.
Figure 6:
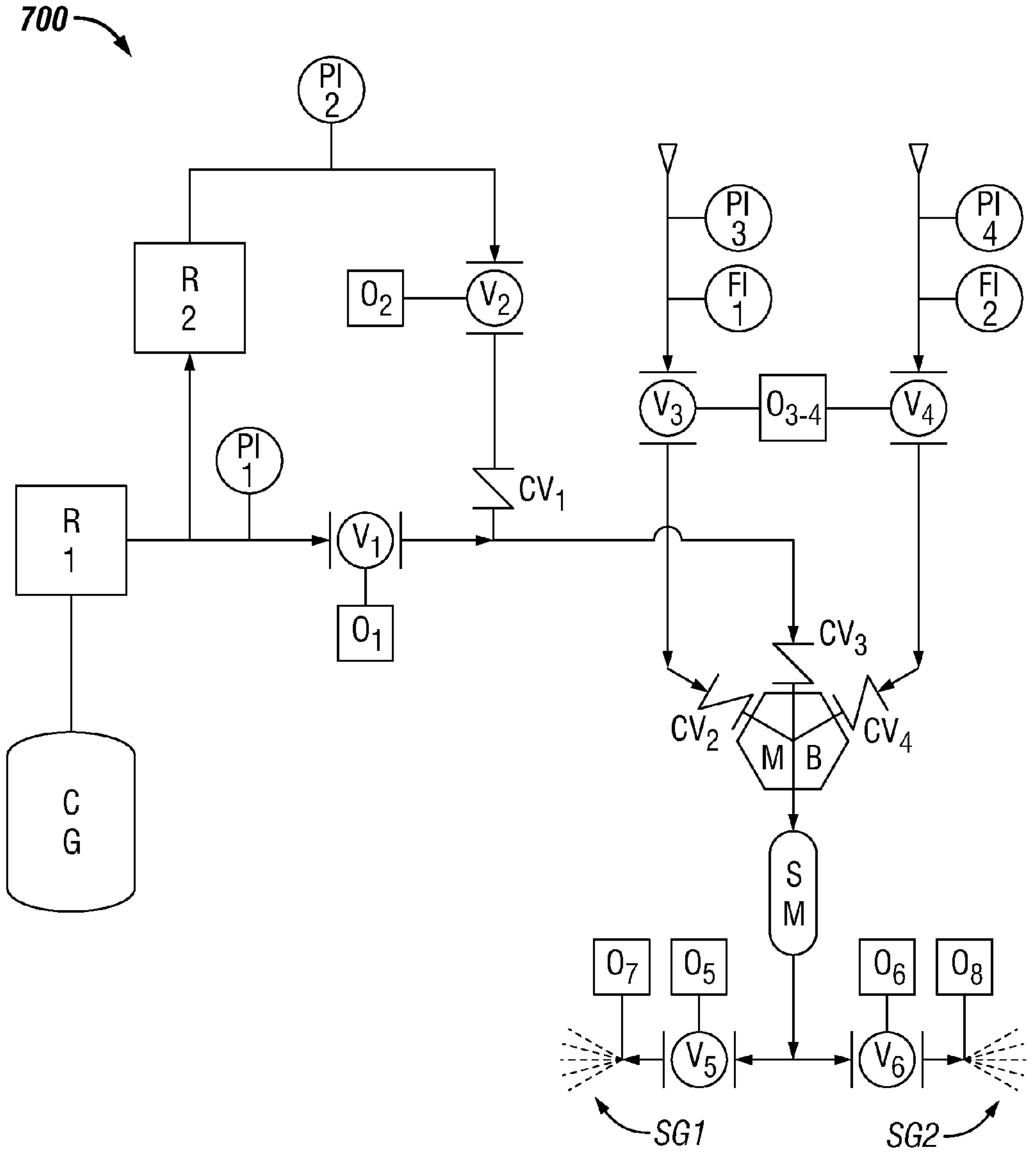
FIG. 6 illustrates a schematic view of the purge system.

FIG. 4 and FIG. 5 illustrate a diagrammatic view of the purge system 600 physical layout. FIG. 4 illustrates a front view of the panel and housing containing purge system 600. FIG. 5 illustrates a side view of the panel and housing containing purge system 600. FIG. 6 illustrates a schematic view of the purge system.

A regulated compressed gas, in one example, Argon gas at 2500 psi, is introduced or otherwise made available to the input of Regulator R2 (626) and Valve V1 (614). Pressure Indicator PI1 (624) measures and indicates the pressure of the regulated compressed gas upstream from Regulator R2 (626) and Valve V1 (614). Operator O1 (616) controls Valve V1 (614). In one example, Regulator R2 (626) provides the compressed gas at a regulated 100 psi. Regulator R2 (626) provides the “low pressure” regulated compressed gas to Valve V2 (622). Operator O2 (620) controls Valve V2 (622). Pressure Indicator PI2 (618) measures and indicates the pressure of the regulated compressed gas downstream from Regulator R2 (626) and upstream from Valve V2 (622). Valve V2 (622) opens downstream into Check Valve CV1 (628). Check Valve CV1 (628) empties downstream from Valve V1 (614). Check Valve CV1 (628) prevents high pressure gas from an opened Valve V1 (614) from back flowing into the downstream side of Valve V2 (622) which is designed to deliver lower pressure gas regulated from Regulator R2 (626). The downstream sides of Check Valve CV1 (628) and Valve V1 (614) are connected to the upstream side of Check Valve V3 (606), shown as a gang of two check valves in the illustrated example of FIG. 4. The downstream side of Check Valve CV3 (606) empties into Mixing Block MB (604). In the illustrated example of FIG. 4, downstream side of one of ganged Check Valve CV3 (606) empties into Check Valve CV2 (630) and the downstream side of one of ganged Check Valve CV3 (606) empties into Check Valve CV4 (604). Check Valve CV2 (630) and Check Valve CV4 (604) in turn empties into Mixing Block MB (604). Check Valve V3 (606) prevents pressures and materials in Mixing Block MB (604) from back flowing into the gas line connecting to Check Valve CV1 (628) and Valve V1 (614).

In one example, Valve V1 is a two position ball valve capable of operation during a high pressure flush. In one example, Operator O1 is a 90-degree operator that is capable of placing Valve V1 in an open and in a closed state. In one example, Valve V2 is a two position ball valve capable of operation during a low pressure flush. In one example, Operator O2 is a 90-degree operator that is capable of placing Valve V2 in an open and in a closed state.

In one example, Pressure Indicator PI1 is a pressure transducer capable of being monitored by a programmable logic controller. In one example the pressure transducer and programmable logic controller combination is capable of producing an error condition when the measured pressure of the gas exceeds a desired level.

In one example, Pressure Indicator PI3 is a pressure transducer capable of being monitored by a programmable logic controller. In one example the pressure transducer and programmable logic controller combination is capable of producing an error condition when the measured pressure of component A is not within a desired range.

In one example, Flow Indicator FI1 is a flow meter that is capable of being monitored by a programmable logic controller. In one example the flow meter and programmable logic controller combination is capable of producing an error condition when the measured flow rate of component A is not within a desired range.

In one example, Pressure Indicator PI4 is a pressure transducer capable of being monitored by a programmable logic controller. In one example the pressure transducer and programmable logic controller combination is capable of producing an error condition when the measured pressure of component B is not within a desired range.

In one example, Flow Indicator FI2 is a flow meter that is capable of being monitored by a programmable logic controller. In one example the flow meter and programmable logic controller combination is capable of producing an error condition when the measured flow rate of component B is not within a desired range.

In one example, the combination of flow meters and programmable logic controller is capable of producing an error condition when the measured ratio of the flow rate of component A and component B is not within a desired range.

In one example, Valve V3 is a two position ball valve capable of operation to control the flow of component A. In one example, Valve V4 is a two position ball valve capable of operation to control the flow of component B. In one example, Operator O34 is a 90-degree operator that is capable of simultaneously placing Valve V3 and Valve V4 in either an open or in a closed state.

In one example, Valve V5 is a two position ball valve capable of turning the gas to a first spray gun on or off. In one example, Operator O5 is a 90-degree operator that is capable of placing Valve V5 in an open and in a closed state. In one example, Operator O7 is a 180-degree operator that is capable of operating a first spray gun tip in a spray or in a flush state.

In one example, Valve V6 is a two position ball valve capable of turning the gas to a second spray gun on or off. In one example, Operator O6 is a 90-degree operator that is capable of placing Valve V6 in an open and in a closed state. In one example, Operator O8 is a 180-degree operator that is capable of operating a spray gun tip in a spray or in a flush state.

In one example, Valve V2 is a two position ball valve capable of operation during a low pressure flush. In one example, Operator O2 is a 90-degree operator that is capable of placing Valve V2 in an open and in a closed state.

A first component of a plural component coating material is fed to the upstream side of a Valve V3 (608). In one example, the proportioning pumps and associated flow lines are located separate from the housing of the coating system. Flow Indicator FI1 and Pressure Indicator PI3, in one example located upstream of purge system 600 physical housing, measure the flow rate and pressure of the first component. A second component of a plural component coating material is fed to the upstream side of a Valve V4 (612). Flow Indicator FI2 and Pressure Indicator PI4, in one example located upstream of purge system 600 physical housing, measure the flow rate and pressure of the second component. Operator O34 (610) controls Valve V3 (608) and Valve V4 (612) in a ganged fashion. The downstream side of Valve V3 (608) feeds into a Check Valve CV2 (630) which, in turn, feeds into Mixing Block MB (604). Check Valve CV2 (630) prevents pressures and materials in Mixing Block MB (604) from back flowing into the first component line connecting to Valve V3 (608). The downstream side of Valve V4 (612) feeds into a Check Valve CV4 (602) which, in turn, feeds into Mixing Block MB (604). Check Valve CV4 (602) prevents pressures and materials in Mixing Block MB (604) from back flowing into the first component line connecting to Valve V4 (612).

Mixing Block MB (604) provides a volume for turbulent mixing of the first component and the second component of the coating material. Mixing Block MB (604) empties into a Static Mixer SM which is configured, positioned, and arranged to further provide an environment where the two components will mix and react with one another. The mixed components form the coating material 162 which then feeds from the Static Mixer SM to, in one example, a Valve V5 and a Valve V6. Operator O5 controls Valve V5 and Operator O6 controls Valve V6. Downstream of Valve V5, an Operator O7 controls the exit of the coating material by way of a Spray Gun SG1. Downstream of Valve V6, and Operator O8 controls the exit of the coating material by way of a Spray Gun SG2. The spray 160 of the coating material exits onto the pipe work piece 150.

Figure 7:
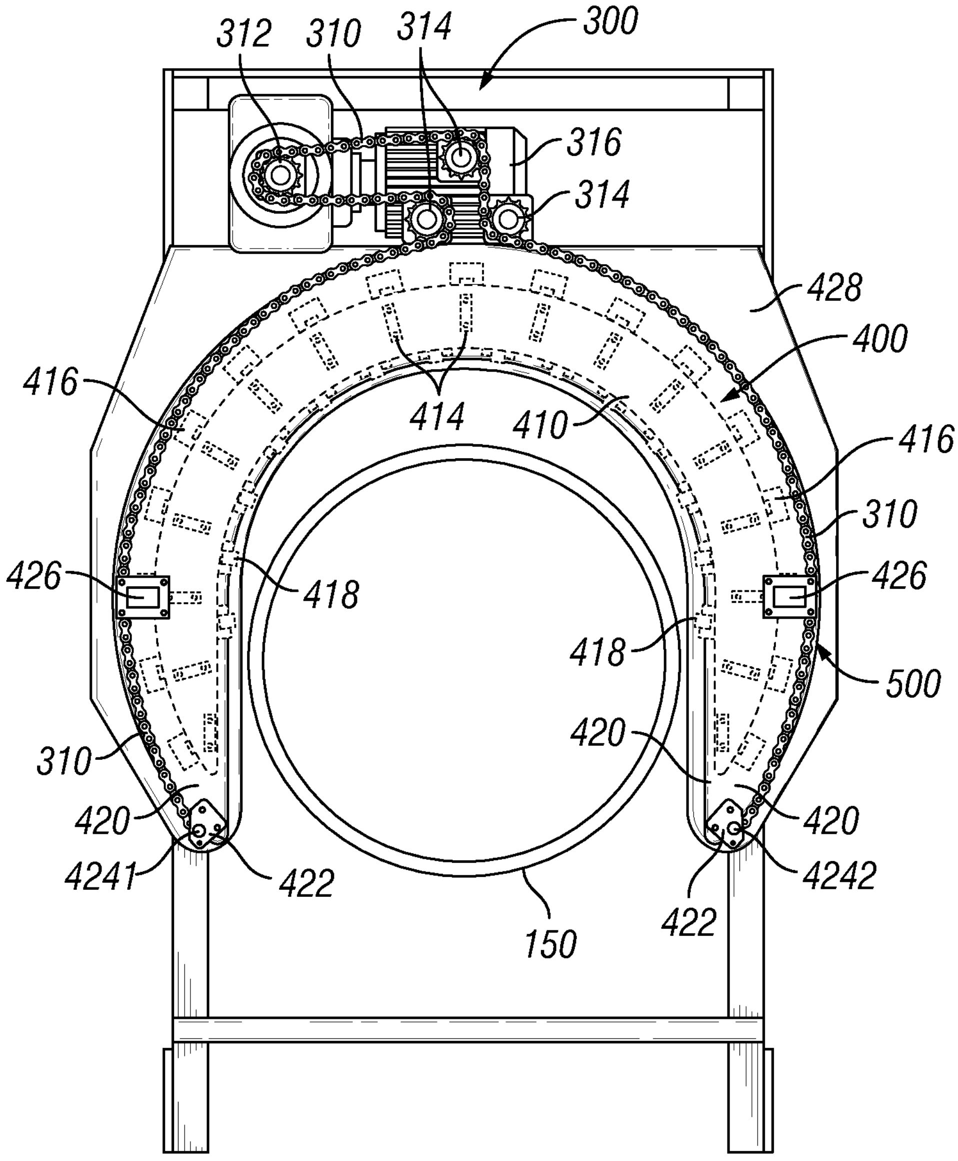
FIG. 7 illustrates a front view of the oscillation mechanism: oscillation drive mechanism 300 and oscillating ring assembly 400.

FIG. 7 illustrates a front view of the oscillation mechanism: oscillation drive mechanism 300 and oscillating ring assembly 400. The oscillation mechanism rotates the spray guns SG1 and SG2 in an arcuate or arc-like path about the longitudinal axis of the pipe work piece. The rotation is generally performed in a back and forth oscillation or agitation. Mounting Plate 428 provides the frame for the supporting the oscillation mechanism components and for mounting to the line travel system housing. Mounting plate 428 is saddle-shaped with a downward opening to accommodate the passing of a pipe work piece 150 there through. A first series of inner cam followers 416 are arranged in a first arc path on the face of Mounting Plate 428, the arc of cams followers 416 disposed about the downward opening of Mounting Plate 428. A second series of outer cam followers 418 are arranged in a second arc path on the face of Mounting Plate 428, positioned parallel to and a distance from the arc of the first series of cam followers 416. A first C-shaped inner ring 410 is disposed between the two series of cam followers 416 and 418, the face of inner ring 410 being parallel to the face of Mounting Plate 428. The C-shaped inner ring 410 forms a rotatable platform for mounting a second C-shaped outer ring 420. C-shaped outer ring 420 is disposed on the face of inner ring 410, the face of outer ring 420 being parallel to the face of Mounting Plate 428 & inner ring 410. Outer ring 420 has a larger outside diameter than inner ring 410. The C-shaped opening of both inner ring 410 and outer ring 420 opens to accommodate the passing of a pipe work piece 150 there through.

Spray gun flip mechanism mounts 426 are disposed on the face of outer ring 420. Spray gun flip mechanism mounts 426 receive spray gun flip module assemblies 500. Above the inner ring 410 and outer ring 420 assembly is an oscillating or reversing motor 316 attached to a sprocket 312. A drive chain 310 loops around sprocket 312 and is guided by idler sprockets 314 to wrap about either side of the outer diameter edge of outer ring 420. One end of drive chain 310 attaches to one end 4241 of outer ring 420 and the other end of drive chain 310 attaches to the other end 4242 of outer ring 420.

In operation, reversing motor 316 pulls drive chain 310 to and fro, either pulling one end 4241 of outer ring 420 upward or pulling the other end 4242 of outer ring 420 upward. This causes outer ring 420 to rotationally oscillate, which is made possible by the fitting of attached inner ring 410 between the two series of cam followers 416 and 418 that are arranged in arc paths. This configuration provides for smooth and precise movement and positioning of the spray gun flip module assemblies 500, attached to spray gun flip mechanism mounts 428, along an arcuate or arc-like path about the outside circumference of the pipe work piece 150.

In one example, the oscillation module oscillates the application heads—the spray guns—around the pipe work piece. In one example, the oscillation module oscillates two spray guns through a 180 degree arc. In one example, the oscillation module oscillates three spray guns through a 120 degree arc, depending on how the unit is set up. In one example, an electric gear motor drives the oscillation mechanism at a uniform rate. In one example, the speed of the electric motor, and consequently the rate or speed of oscillation, is controlled by the variable frequency drive associated with the motor.

Figure 8:
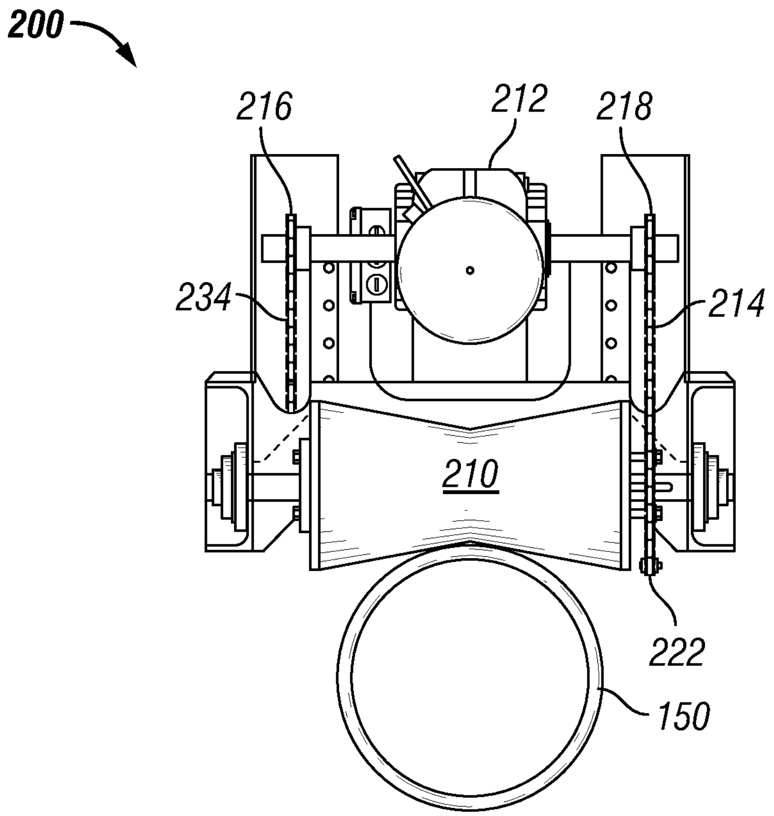
FIG. 8 illustrates a rear view of the line travel drive assembly 200.

FIG. 8 illustrates a rear view of the line travel drive assembly 200. In this view, rear V-roller VR2 (210) is resting on top of pipe work piece 150. Motor 212 is positioned above the plane of the V-rollers. Drive Sprocket DS1 (216) and DS2 (218) are on either side of motor 212 and in the plane of motor 212. Drive Sprocket DS2 (218) connects to Drive Chain DC2 (214) which traverses down to the plane of the axis of rear V-roller VR2 (210), transferring rotational motion from motor 212 and Drive Sprocket DS2 (218) to roller sprocket 220 which, in turn, rotates V-roller VR2 (210).

Figure 9:
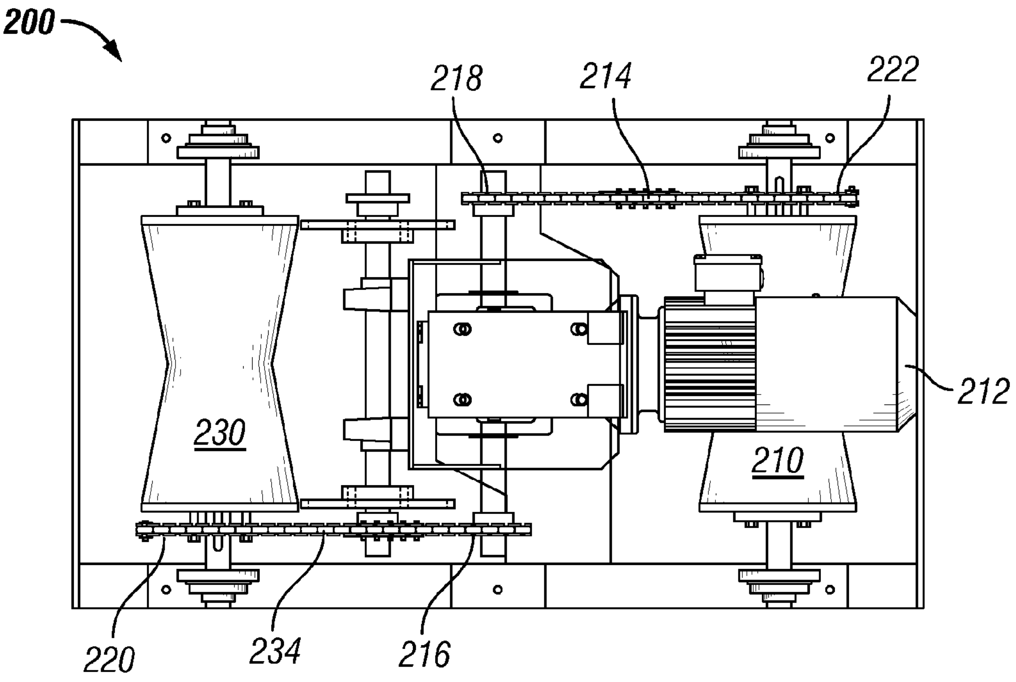
FIG. 9 illustrates a top view of the line travel drive assembly 200.

FIG. 9 illustrates a top view of the line travel drive assembly 200. The line travel coating system traverses longitudinally along the pipe work piece by operation of the line travel drive assembly. Two V-rollers VR1 (230) and VR2 (210) lay on top of the pipe work piece 150, the "V" shape providing a friction surface for contact with the pipe work piece 150. V-roller VR1 (230) is axially attached to a roller sprocket 220. V-roller VR1 (230) is powered by roller sprocket 220 connected to a drive chain DC 1 (234) which is in turn connected to a drive sprocket DS1 (216) that is rotated by a motor 212. V-roller VR2 (210) is powered by roller sprocket 222 connected to a drive chain DC2 (214) which is in turn connected to a drive sprocket DS2 (218) that is rotated by motor 212.

Figure 10:
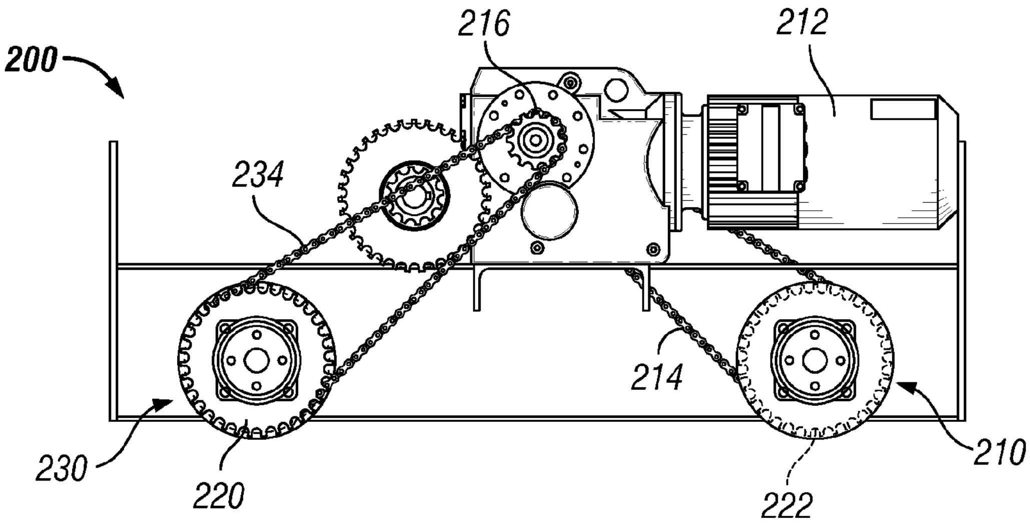
FIG. 10 illustrates a side view of the line travel drive assembly 200.

FIG. 10 illustrates a side view of the line travel drive assembly 200. In this view, motor 212 is positioned above the plane of the V-rollers (210 and 230). Drive Sprocket DS1 (216) is attached to the axis of the motor 212. Drive Sprocket DS1 (216) connects to Drive Chain DC1 (234) which traverses down to the plane of the axis of front V-roller VR1 (230), transferring rotational motion from motor 212 and Drive Sprocket DS1 (216) to V-roller VR1 (230) via roller sprocket 220. Drive Sprocket DS2 (218) connects to Drive Chain DC2 (214) which traverses down to the plane of the axis of rear V-roller VR2 (210), transferring rotational motion from motor 212 and Drive Sprocket DS2 (218) to V-roller VR2 (210) via roller sprocket 220. This configuration provides for smooth and precise movement and positioning of line travel drive assembly, the oscillation mechanism, and the spray guns in the longitudinal direction of pipe work piece 150.

In one example, the line travel drive assembly moves the coating system down the pipe work piece at a uniform rate of speed. In one example, an electric gear motor drives two hourglass rollers. In one example, the electric gear motor is capable of moving the system in a forward or reverse direction. In one example, the electric motor is controlled by a variable frequency drive. In one example, the electric motor and line travel assembly is also equipped with a brake to prevent the system from rolling forward or backward when stopped on an incline.

In one example, the line travel drive assembly is configured to be capable of moving the coating system on grades up to 20% (slopes up to 11.3 degrees).

Figure 11A:
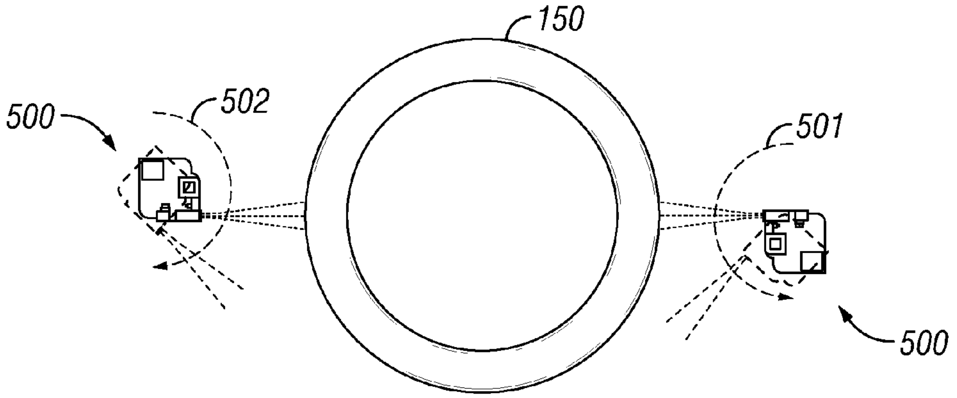
FIG. 11A illustrates a diagrammatic radial view of spray gun flip module 500 at start and purge position.

FIG. 11A illustrates a diagrammatic radial view of spray gun flip module at start and purge position. In one example, one spray gun flip module 500 is disposed on the left side of a work piece and a second spray gun flip module 500 is disposed on the right side of a work piece. The two spray gun flip modules 500 are designated as Spray Gun 1 and Spray Gun 2. Spray Gun 1 and Spray Gun 2 sprays coating material onto the pipe work piece by aligning the gun spray approximately perpendicular to the surface of the work piece. This position is also called the home position. In this sense, in this example, the starting position of the spray guns relative to oscillation about the work piece is a "3 o'clock" position for Spray Gun 1 and a "9 o'clock" position for Spray Gun 2. When spray gun purging is desired, Spray Gun 1 must rotate the spray away from the work piece. This rotation is approximately about an axis of the spray gun assembly. This is accomplished by rotating the spray of Spray Gun 1 counter-clockwise away from the work piece, as viewed into the longitudinal axis of the work piece. This rotational movement is designated by rotation 501. For Spray Gun 2, this is accomplished by rotating the spray of Spray Gun 2 clockwise away from the work piece, as viewed down the same longitudinal axis of the work piece. This rotational movement is designated by rotation 502.

Figure 11B:
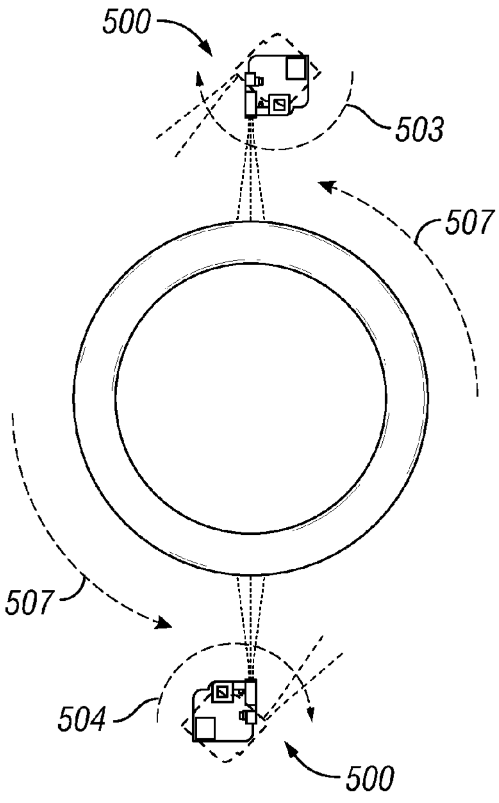
FIG. 11B illustrates a diagrammatic radial view of spray gun flip module 500 at feathering and clockwise flip position.

FIG. 11B illustrates a diagrammatic radial view of spray gun flip module at feathering and clockwise flip position. In one example, one spray gun flip module 500 is disposed on the left side of a work piece and a second spray gun flip module 500 is disposed on the right side of a work piece. The two spray gun flip modules 500 are designated as Spray Gun 1 and Spray Gun 2. The oscillation of the spray guns from the starting position places Spray Gun 1 in a "12 o'clock" position and Spray Gun 2 in a "6 o'clock" position. The rotation of the spray guns about the axis of the pipe work piece is counter-clockwise. This rotational movement is designated by rotation 507. This represents the extent of travel in one of the oscillation directions. To feather the spray coating, the spray guns now "flip" away from the work piece. This is accomplished by rotating the spray of Spray Gun 1 clockwise away from the work piece.

This rotation is approximately about an axis of the spray gun assembly. This rotational movement is designated by rotation 503. The rotation is opposite of the rotation required for purging when Spray Gun 1 was in the "3 o'clock" position and rotated counter-clockwise away from the work piece. For Spray Gun 2, this is accomplished by rotating the spray of Spray Gun 2 clockwise away from the work piece. This rotation is approximately about an axis of the spray gun assembly. This rotational movement is designated by rotation 504. The rotation is the same as the rotation required for purging when Spray Gun 2 was in the "9 o'clock" position and rotated clockwise away from the work piece.

Figure 11C:
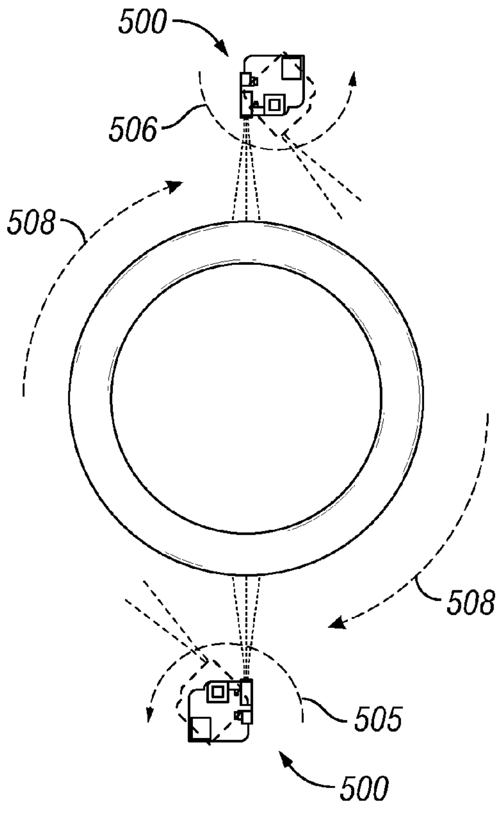
FIG. 11C illustrates a diagrammatic radial view of spray gun flip module 500 at feathering and counter-clockwise flip position.

FIG. 11C illustrates a diagrammatic radial view of spray gun flip module at feathering and counter-clockwise flip position. In one example, one spray gun flip module 500 is disposed on the left side of a work piece and a second spray gun flip module 500 is disposed on the right side of a work piece. The two spray gun flip modules 500 are designated as Spray Gun 1 and Spray Gun 2. The oscillation of the spray guns from the starting position places Spray Gun 1 in a "6 o'clock" position and Spray Gun 2 in a "12 o'clock" position. The rotation of the spray guns about the axis of the pipe work piece is clockwise. This rotational movement is designated by rotation 508. This represents the extent of travel in the other oscillation direction. To feather the spray coating, the spray guns once again "flip" away from the work piece. This rotation is approximately about an axis of the spray gun assembly. This is accomplished by rotating the spray of Spray Gun 1 counter-clockwise away from the work piece. The rotation is the same as the rotation required for purging when Spray Gun 1 was in the "3 o'clock" position and rotated counter-clockwise away from the work piece. This rotational movement is designated by rotation 505. For Spray Gun 2, this is accomplished by rotating the spray of Spray Gun 2 counter-clockwise away from the work piece. The rotation is opposite of the rotation required for purging when Spray Gun 2 was in the "9 o'clock" position and rotated clockwise away from the work piece. This rotational movement is designated by rotation 506.

Figure 12:
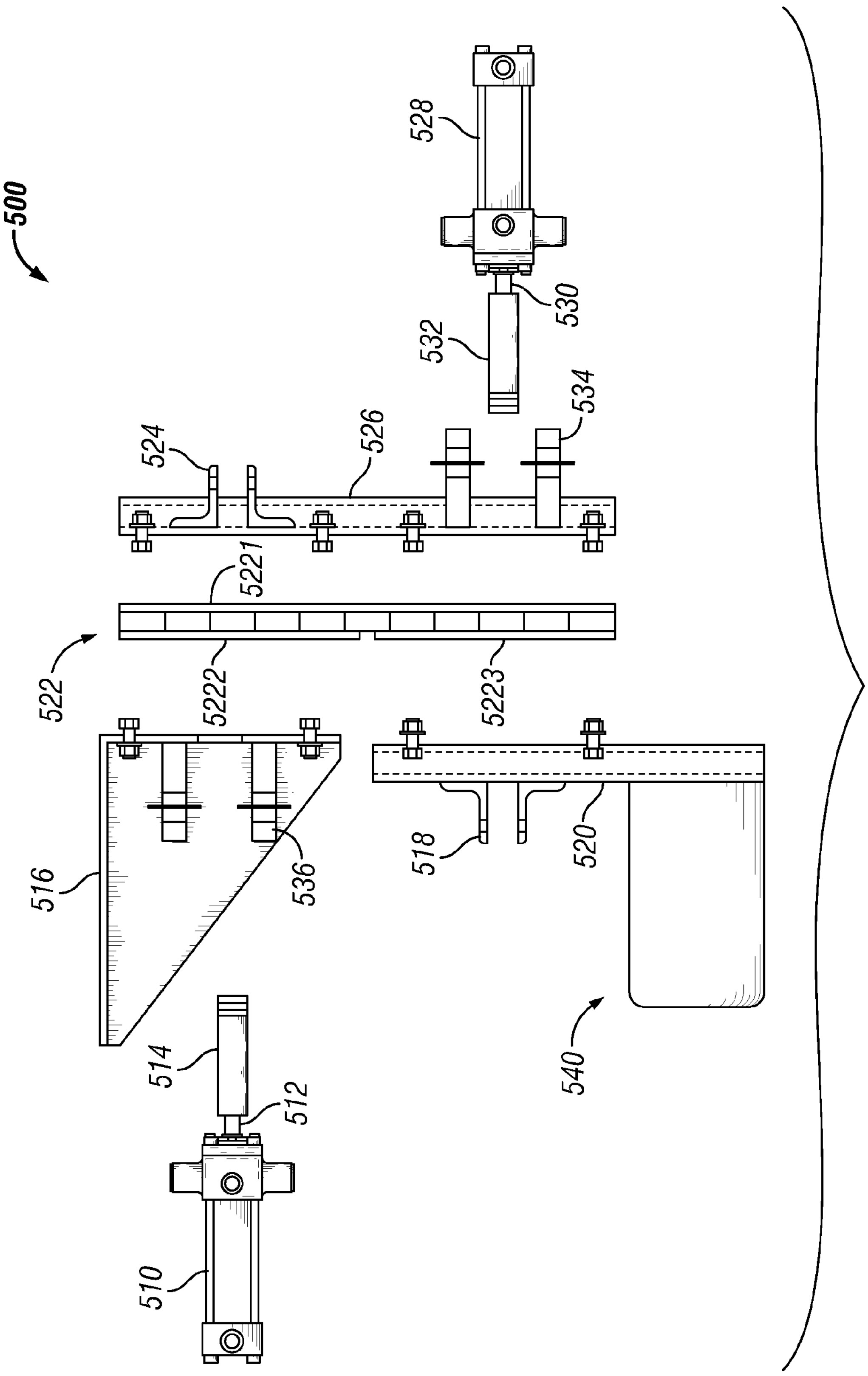
FIG. 12 illustrates an exploded view of the spray gun flip module 500.

FIG. 12 illustrates an exploded view of the spray gun flip module assembly 500. In one example, the spray guns 540 are capable of independently rotating about an axis of the flip module assembly, both in the clockwise direction and in the counter-clockwise direction. For example, Spray Gun 1 rotates the spray away in the counter-clockwise direction at the 3 o'clock purge position, in the clockwise direction at the 12 o'clock feather position, and in the counter-clockwise direction at the 6 o'clock feather position. At the same time, Spray Gun 2 rotates the spray away in the clockwise direction at the 9 o'clock purge position and the 6 o'clock feather position, and in the counter-clockwise direction at the 12 o'clock feather position.

To rotate the flip module assembly 500 in either a clockwise or a counter-clockwise direction about an axis of the spray gun assembly, a hinge with one split leaf is employed. Hinge 522 includes one leaf or wing 5221 on one (right) side and two independent leaves or wings 5222 and 5223 on the other (left) side of a pin or barrel. The two independent leaves or wings 5222 and 5223 are disposed laterally along the longitudinal axis of the pivot of the pin or barrel of hinge 522. Leaf 5222 opens or closes relative to leaf 5221 independently from the opening or closing of leaf 5223 relative to leaf 5221. The components of the spray gun assembly are ultimately attached to one of the three leaves 5221, 5222, or 5223.

Mounting bracket 516 secures the spray gun assembly 500 to the spray gun flip mechanism mount 426 of oscillation ring assembly 400. Mounting bracket 516 is a triangular shaped brace that includes one side for attachment to one independent leaf 5222 of hinge 522. Mounting bracket 516 includes a trunnion mount 536 for receiving an air cylinder 510. Trunnion mount 536 pivotally secures air cylinder 510 to mounting bracket 516. Air cylinder 510 incorporates an actuation rod 512 which, in turn, attaches to an extension rod 514.

Trunnion mount 536 is positioned and arranged to dispose actuation rod 512 and extension rod 514 in the direction of independent leaf 5222 of hinge 522.

On the same side as mounting bracket 516, a bottom plate 520 attaches to independent leaf 5223. Bottom plate 520 provides a mounting surface to secure a spray gun 540. A pivot mount 518 is disposed on bottom plate 520 for receiving a rod extension 532. Rod extension 532 is connected to the actuation rod 530 of a second air cylinder 528.

A top plate 526 attaches to leaf 5221 of hinge 522, opposite of leaves 5222 and 5223. A pivot mount 524 is disposed on top plate 526 in the longitudinal portion of hinge 522 that is shared with independent leaf 5222. Pivot mount 524 receives previously mentioned rod extension 514. Openings in independent leaf 5222 and leaf 5221 of hinge 522 enable rod extension 514 to extend through leaves 5222 and 5221 to pivotally attach to pivot mount 524.

Actuation of air cylinder 510 causes actuation rod 512 through extension rod 514 to push against pivot mount 524, resulting in rotating all components mounted to hinge 522 on leaves 5221 and 5223 away from mounting bracket 516. Mounting bracket 516, being mounted to oscillation ring assembly 400, causes spray gun 540 to rotate in one direction relative to an axis of the spray gun assembly 500. In one example, the pin or barrel of hinge 522 forms the rotational axis.

Returning to top plate 526, a trunnion mount 534 for receiving second air cylinder 528 is disposed on top plate 526 in the longitudinal portion of hinge 522 that is shared with independent leaf 5223. Trunnion mount 534 pivotally secures air cylinder 528 to top plate 526. Air cylinder 528 incorporates an actuation rod 530 which, in turn, attaches to an extension rod 532. Trunnion mount 534 is positioned and arranged to dispose actuation rod 530 and extension rod 532 in the direction of independent leaf 5223 of hinge 522.

Returning to bottom plate 520, pivot mount 518 is disposed on bottom plate 520 for receiving rod extension 532. Pivot mount 518 receives previously mentioned rod extension 532. Openings in leaf 5221 and independent leaf 5223 of hinge 522 enable rod extension 532 to extend through leaves 5221 and 5223 to pivotally attach to pivot mount 518.

Actuation of air cylinder 528 causes actuation rod 530 through extension rod 532 to push against pivot mount 518, resulting in rotating all components mounted to bottom plate 520 on leaf 5223 away from top plate 526. This rotation is in a direction opposite of that caused by the actuation of cylinder 510 upon top plate 526. Spray gun 540, therefore, is caused to rotate relative to an axis of the spray gun assembly 500. In one example, the pin or barrel of hinge 522 forms the rotational axis.

In this example, the split leaf hinge and cylinder combination provides one means for independent rotation of the spray gun about an axis of the spray gun assembly, the pin or barrel of hinge 522, both in the clockwise direction and in the counter-clockwise direction.

Figure 13A:
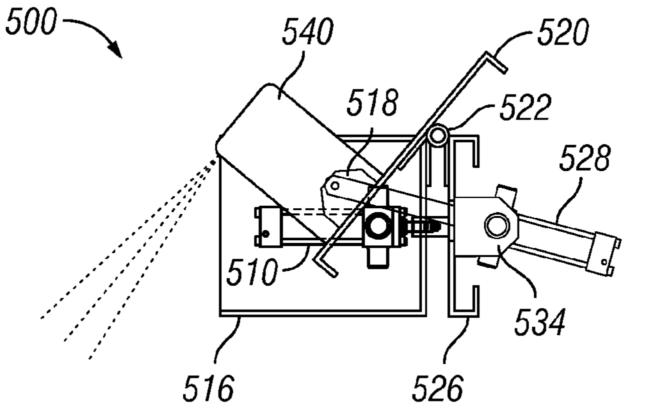
FIG. 13A illustrates a top view of the spray gun flip module 500 undergoing clockwise rotation.

FIG. 13A illustrates a top view of the spray gun flip module undergoing clockwise rotation. Trunnion mount 534 pivotally secures air cylinder 528 to top plate 526. Actuation of air cylinder 528 causes actuation rod 530 through extension rod 532 to push against pivot mount 518. Bottom plate 520 is rotated clockwise about the pin or barrel of hinge 522 with respect to mounting bracket 516. Air cylinder 510 is not actuated, leaving top plate 526 (and leaf 5221) in a closed position relative to mounting bracket 516 (and independent leaf 5222). Spray gun 540, which is attached to bottom plate 520, thereby rotates clockwise by activation of air cylinder 528.

Figure 13B:
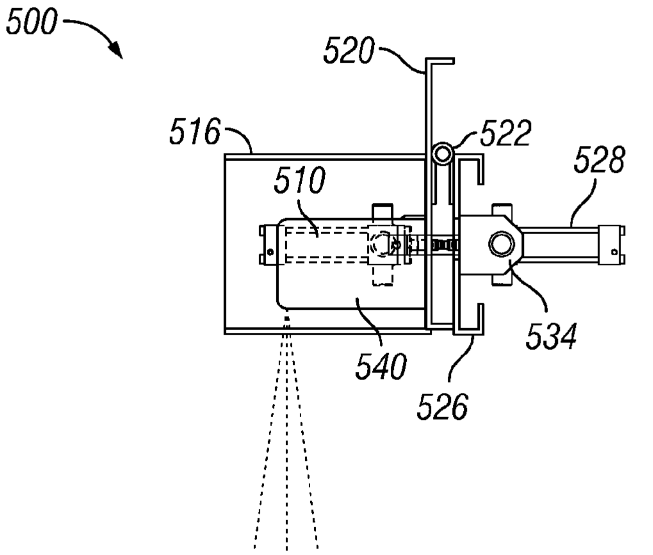
FIG. 13B illustrates a top view of the spray gun flip module 500 in the home position, no rotation.

FIG. 13B illustrates a top view of the spray gun flip module in the home position, no rotation. Trunnion mount 534 pivotally secures air cylinder 528 to top plate 526. Air cylinder 528 is not actuated, leaving top plate 526 (and leaf 5221) in a closed position relative to bottom plate 520 (and independent leaf 5223). Air cylinder 510 is not actuated, leaving top plate 526 (and leaf 5221) in a closed position relative to mounting bracket 516 (and independent leaf 5222). Spray gun 540, which is attached to bottom plate 520, is therefore not rotated.

Figure 13C:
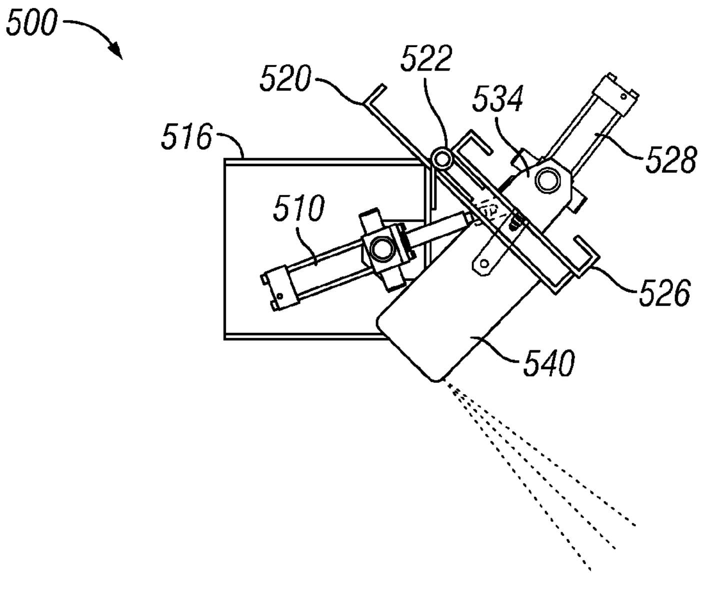
FIG. 13C illustrates a top view of the spray gun flip module 500 undergoing counter-clockwise rotation.

FIG. 13C illustrates a top view of the spray gun flip module undergoing counter-clockwise rotation. Actuation of air cylinder 510 causes actuation rod 512 through extension rod 514 to push against pivot mount 524. Top plate 526 is rotated counter-clockwise about the pin or barrel of hinge 522 with respect to mounting bracket 516. The rotation results in top plate 526 in an open position relative to mounting bracket 516 (and independent leaf 5222). Air cylinder 528 is not actuated, leaving top plate 526 (and leaf 5221) in a closed position relative to bottom plate 520 (and independent leaf 5223). Spray gun 540, which is attached to bottom plate 520, thereby rotates counter-clockwise by activation of air cylinder 510.

In one example, actuation of both air cylinder 510 and air cylinder 528 does not result in an error state as the combined actuation results in a net zero rotation.

In one example, work piece 150 is receiving a spray of a coating material from spray gun assemblies 500. Pipe work piece 150 is shown in FIG. 11A with the axial direction of the work piece pointing into the illustration. The spray is being applied about the circumference of the work piece. A first spray gun assembly 500 is in a 3 o'clock position and a second spray gun assembly 500 is in a 9 o'clock position relative to the work piece 150. The spray is approximately perpendicular to the outside surface of the work piece 150 at the 9 o'clock position. To purge the spray guns, the spray must be rotated away from the work piece. Rotation 502 illustrates a clockwise rotation of the spray gun 540 (FIG. 12) about the axis of spray gun assembly 500. Rotation 502 shows how the spray is feathered away and downward from work piece 150, allowing purging of the spray gun and avoiding application of the purging materials from the spray gun to the work piece. In one example, this is accomplished by actuation of cylinder 528 pushing plate 520 to rotate and feather spray gun 540 away from the work piece. In a similar manner, Rotation 501 illustrates a counter-clockwise rotation of the first spray gun 540 about the axis of first spray gun assembly 500. Rotation 501 shows how the spray is feathered away and downward from work piece 150, allowing purging of the spray gun and avoiding application of the purging materials from the spray gun to the work piece. In one example, this is accomplished by actuation of cylinder 510 pushing plate 526 to rotate and feather first spray gun 540 away from the work piece.

In one example, work piece 150 is receiving a spray of a coating material from spray gun assemblies 500. Pipe work piece 150 is shown in FIG. 11B with the axial direction of the work piece pointing into the illustration. The spray is being applied about the circumference of the work piece. A first spray gun assembly 500 is in a 12 o'clock position and a second spray gun assembly 500 is in a 6 o'clock position relative to the work piece 150. The spray is approximately perpendicular to the outside surface of the work piece 150 at the 6 o'clock position. This is at the end of the arc-like path of the oscillation. To feather the spray at the end of the path of oscillation, the spray must be rotated away from the work piece. Rotation 504 illustrates a clockwise rotation of the spray gun 540 (FIG. 12) about the axis of spray gun assembly 500. Rotation 504 shows how the spray is feathered away and downward from work piece 150, avoiding application of an excess of coating material from the spray gun to the work piece. In one example, this is accomplished by actuation of cylinder 528 pushing plate 520 to rotate and feather spray gun 540 away from the work piece. In a similar manner, Rotation 503 illustrates a clockwise rotation of the first spray gun 540 about the axis of first spray gun assembly 500. Rotation 503 shows how the spray is feathered away from work piece 150, avoiding application of an excess of coating material from the spray gun to the work piece. In one example, this is accomplished by actuation of cylinder 528 pushing plate 520 to rotate and feather first spray gun 540 away from the work piece.

In one example, work piece 150 is receiving a spray of a coating material from spray gun assemblies 500. Pipe work piece 150 is shown in FIG. 11C with the axial direction of the work piece pointing into the illustration. The spray is being applied about the circumference of the work piece. A first spray gun assembly 500 is in a 6 o'clock position and a second spray gun assembly 500 is in a 12 o'clock position relative to the work piece 150. The spray is approximately perpendicular to the outside surface of the work piece 150 at the 12 o'clock position. This is at the other end of the arc-like path of the oscillation. To feather the spray at the end of the path of oscillation, the spray must be rotated away from the work piece. Rotation 506 illustrates a counter-clockwise rotation of the spray gun 540 (FIG. 12) about the axis of spray gun assembly 500. Rotation 506 shows how the spray is feathered away and upward from work piece 150, avoiding application of an excess of coating material from the spray gun to the work piece. In one example, this is accomplished by actuation of cylinder 510 pushing plate 526 to rotate and feather spray gun 540 away from the work piece. In a similar manner, Rotation 505 illustrates a counter-clockwise rotation of the first spray gun 540 about the axis of first spray gun assembly 500. Rotation 505 shows how the spray is feathered away and downward from work piece 150, avoiding application of an excess of coating material from the spray gun to the work piece. In one example, this is accomplished by actuation of cylinder 510 pushing plate 526 to rotate and feather first spray gun 540 away and downward from the work piece.

One or more programmable logic controllers are used to manage the operation of the coating system. In one example, the one or more programmable logic controllers are mounted in a separate "Motor Control Center". In another example, the one or more programmable logic controllers are mounted in a convenient location in the housing of the line travel system. In one example, a programmable logic controller is programmed to receive a flow measurement of component A and/or component B. In one example, a programmable logic controller collects measurements from Flow Indicator FI1 and/or Flow Indicator FI2. The program logic controller also receives user input parameters, including a parameter for a selected desired coating thickness and a parameter related to the outer diameter of the work piece. In one example, the logic controller is further programmed to control the rate of oscillation of the oscillating ring assembly 400 based at least in part on the received flow measurements, the selected desired coating thickness and the outer diameter of the work piece. In one example, the formula for determining the rate of oscillation, the oscillation frequency, is:

$$Os=\{Ko*Rd*F*P*(1-L)\}/\{Sw*T*D\}; \qquad (1)$$

where:

Os is the oscillation speed, rate of oscillation, oscillation frequency expressed as the chain speed (for example, the speed in meters per minute of drive chain 310);

Ko is a constant oscillation speed constant (for example, 9.549×10E-3);

Rd is an operator-user input actual rotating degrees (for example, 180 or 178 or 182);

F is flow rate (for example, number of liters per minute as measured by FI1 and/or FI2);

P is an operator-user input of the number of passes required; L is an operator-user input to compensate for spray loss, expressed with 1 representing 100%;

Sw is an operator-user input of the spray pattern width (for example, expressed in meters);

T is an operator-user input of the coating thickness (for example, expressed in millimeters);

D is an operator-user input of the pipe diameter (for example, expressed in meters).

In a similar fashion, a programmable logic controller controls the speed of traversal along the pipe work piece. In one example the logic controller manages the speed of the of line travel drive mechanism 200. Conceptually, the speed of line travel is based at least in part on the rate of oscillation of the first drive mechanism and based at least in part on the selected width of the spray. In one example, the formula for determining the speed of traversing is:

$$Ts=\{Kt*F*(1-L)\}/\{T*D\}; \qquad (2)$$

where:

Ts is the speed of traversing or line travel speed, expressed as the chain speed (for example, the speed in meters per minute of traverse);

Kt is a constant travel speed constant (for example, 0.318);

F is flow rate (for example, number of liters per minute as measured by FI1 and/or FI2);

L is an operator-user input to compensate for spray loss, expressed with 1 representing 100%;

T is an operator-user input of the coating thickness (for example, expressed in millimeters);

D is an operator-user input of the pipe diameter (for example, expressed in meters).

A programmable logic controller further controls the timing and sequencing for rotating the spray guns onto or away from the work piece. In one example, the logic controller is programmed to actuate the actuating members of the spray gun assembly to rotate away from the work piece the spray pattern coming from the spray guns. To protect the work piece, the direction of rotation is programmed to be in the direction of the arc-like path that existed prior to reversing direction. For example, the logic controller controls actuation cylinders 510 and 528 on each of the spray gun modules 500 in the patterns previously described, depending on the position of the guns in the course of an oscillation.

A programmable logic controller further controls the timing and sequencing for purge operations. In one example, the logic controller is programmed to actuate operator O1 (616) which opens and closes Valve V1 (614) to provide high pressure inert gas for purge. In one example, the logic controller is programmed to enable opening and closing of Valve V1 within one second. In a like manner, the logic controller controls actuation of low pressure Valve V2. In one example, purging is programmed to occur automatically at specific times in the coating cycle or at occurrence of specific events. In one example, an operator-user is able to command the logic controller to initiate a purge cycle.

In one example, a programmable logic controller is programmed to actuate one or more valves to stop spray of the mixed component materials based on the ratio of the flows of the two components. In one example, the logic controller actuates Valve V3 and Valve V4.

In one example, a programmable logic controller is programmed to control the rate of oscillation of the oscillating drive mechanism based at least in part on a received parameter to allow for overspray. For example, due to spray feathering during flip operation at the end of each oscillation, it is determined that a 178 degree oscillation is required to provide a uniform coating thickness at the ends of the oscillations. An operator-user parameter input is received by the logic controller and used to alter the oscillation rate of the oscillation drive mechanism 300.

In another example, it has been found that the width of the spray changes over time due to nozzle wear. To allow for change in spray width, an operator-user parameter input is received by the logic controller and used to alter the oscillation rate of the oscillation drive mechanism 300.

Examples of System Operation

In one example of operation of the line coating system, one or more of the following steps occur:

100. The programmable logic control executes instructions to verify the following: that the operators (and hence, the valves) are in the proper position; that component A pressure (PI3) is within desired range; that component B pressure (PI4) is within desired range; that the high pressure flush pressure (PI1) is within desired range; and that the low pressure flush pressure (PI2) is within desired range. The logic controller signals a "ready" indicator light or returns an error message.

200. A user-operator presses a "Spray" button, initiating the spraying operation. The logic controller performs the following: actuates Operator O34 (610); begins monitoring the flow of component A (FI1) and component B (FI2); opens Valve V5 and Valve V6; signals a "Spray" indicator light to "on"; signals indicator lights for Operators O5, O6, O7, and O8 to "on"; begins recording flow rate and pressure (PI1, PI2) of components A and B; monitors for error condition in received measurements and performs a shutdown of the system ("Stop" condition) on error condition and reports the error condition.

300. A user-operator or the logic controller initiates a "Stop" condition. The logic controller performs the following: closes Operator O34 (hence, Valve 3 and Valve 4) and stops monitoring flow and pressure of Component A and B; opens Operator O1 to inject high pressure gas into Mixing Block MB (604) to force mixed material through the flow lines to the spray guns; after a predetermined time, closes Operator O1 and opens Operator O2, allowing low pressure gas into Mixing Block MB (604), completing the flushing process; closes Operator O5 and Operator O6 and reverses the spray tip to the flush position by operating Operator O7 and Operator O8; opens Operator O5 and Operator O6; after a predetermined time, closes Operator O5 and Operator O6 and reverses the spray tip to the spray position by operating Operator O7 and Operator O8; opens Operator O5 and Operator O6; after a predetermined time, closes all operators; sets indicator lights to reflect the operations executed.

400. The logic controller is programmed to allow the user-operator to manually test the function of Operator O1, Operator O2, Operator O5, Operator O6, Operator O7, Operator O8. The logic controller is programmed to receive commands from the user-operator to initiate a test of each of these operators.

500. The logic controller is programmed to allow the user-operator to manually press a "Reverse and Clean" button for the each of the spray guns, initiating program code on the logic controller. The user-operator is then able to clean a plugged tip during operation. The logic controller performs the following: closes Operator O5 and/or Operator O6 and reverses the spray tip to the flush position by operating Operator O7 and/or Operator O8; opens Operator O5 and/or Operator O6; after a predetermined time, closes Operator O5 and/or Operator O6 and reverses the spray tip to the spray position by operating Operator O7 and/or Operator O8; opens Operator O5 and/or Operator O6; sets indicator lights to reflect the operations executed.

In one example of operation, the program of the programmable logic controller or computer controls the operation of the line travel system. Once an operator-user presses "start" the coating material valves are opened and the computer monitors the material flow rate. The computer uses the material flow rate and number of application passes desired to determine the oscillation speed. The computer then uses the oscillation speed and number of application passes desired to determine the line travel speed of the unit. The flow rate of both coating components is continually monitored and compared against the metering ratio specified by the coating manufacturer. The system is automatically shut down if the actual ratio goes outside the allowable range.

In a further example, the program records all the pertinent application data including material flow rate, metering ratio, coating thickness on a minute by minute, meter by meter basis. This data can be downloaded to the laptop and reports generated daily. Estimated coating thickness can be compared with actual readings to confirm material losses.

In one example of operation of the coating system, once the system is set on a pipeline pipe work piece, an operator-user closes tension wheels using the small operator panel connected to a control console. In one example, the operator panel includes a joy stick that allows the operator-user to manually move the unit backwards or forwards to get the unit into the proper starting position on the pipe work piece. Once the system is in position, the operator-user presses a "start" button on the operator panel and the coating application begins. The operator-user is able to stop the operation at any time by pressing a "stop" button or an "emergency stop" button, if necessary.

Once the equipment is in the proper position for operation, the computer verifies the following activities: Valve Operators are in the proper position, High Pressure Flush pressure is within desired range, Low Pressure Flush pressure is within desired range, tension wheels are closed, spray guns are "flipped" to a proper starting position. The computer or logic controller turns on a "Ready" indicator or returns an error message.

Once the "Ready" indicator is on the operator-user can press the "start" button and the computer starts the following sequence of activities: opens component A and B valves and begins monitoring flow of component A and Component B, opens application gun valves; turns "Spray" indicator on; turns on indicator(s) for open valves; begins recording flow rate and pressure of component A and B; shuts down the system on any error condition and reports the error condition.

The operator-user observes the spray fan pattern coming from the spray tips. When the proper fan pattern is achieved the operator-user presses the "start" button a second time. The computer or logic controller then performs the following functions: flips the spray guns perpendicular to the pipe surface; starts oscillation of the spray guns at a rate determined by the flow rate of the material insuring that the proper coating thickness is achieved; starting the line travel drive once one oscillation sequence has been completed. The line travel speed is calculated from of the oscillation speed. The line travel unit advances one spray pattern width for each oscillation, again assuring proper coating thickness is maintained at all times. Encoders in the oscillation and drive motors are monitored by the system computer. In addition to establishing the speed of the oscillation and speed of line travel it allows the computer to determine when to reverse the direction of oscillation. When oscillation direction is reversed, the computer "ramps down" the oscillation drive until the motor stops and then "ramps up" the motor in the opposite direction until the desired speed is reached. In one example, the entire "ramp down, ramp up" operation occurs in less than a second. During the oscillation reversing procedure, the computer also "flips" the spray guns off the surface of the pipe momentarily to prevent build-up of the coating material where the oscillation is reversed.

The operator-user presses the "stop" button or the logic controller detects a malfunction. The logic controller then performs the following functions: closes component A and B valves and stops monitoring flow and pressure of Component A and B; "flips" the spray guns off the pipe surface; opens a high pressure gas flush valve and high pressure gas enters the mixing block and forces mixed material through the system to the spray guns; after a predetermined time, closes the high pressure gas flush valve and opens the low pressure gas flush valve, allowing low pressure gas to enter the mixing block, completing the flushing process; closes applicator valves (O5, O6) and reverses the spray tip to the flush position; opens applicator valves; after a predetermined time, closes the applicator valves and reverses the spray tip to the spray position; opens applicator valves; after a predetermined time closes all valves. The logic controller signals indicators to follow the operation.

In one example, the operations described above are controlled from a control console or from a laptop computer, eliminating the need for anybody to be in the pipeline ditch. In one example, certain job information must be entered from the control console or the laptop computer in order to operate the system. In one example, the job information includes: customer, location, date, ambient conditions, line diameter, coating material to be used, coating thickness required, estimated spray loss, number of passes to be used to apply the coating.

In one example, the degrees of oscillation is controlled. The degree of oscillation is primarily affected by the number of applicators used. Two applicators are oscillated through approximately 180 degrees while three applicators are oscillated through only 120 degrees. In one example, the degrees of oscillation are "fine tuned" to minimize the amount of overlap of the application patterns at the ends of the oscillation cycles.

Line Travel speed is primarily controlled by the oscillation speed and the degrees of oscillation. In one example, the object is to travel forward one coating pattern width for each full oscillation. In one example, the computer automatically adjusts the line travel speed based on the oscillation speed. The faster the oscillation speeds, the faster the line travel speed and vice versa. In one example, the line travel speed is fine tuned to provide the minimum amount of overlap of the application patterns, insuring maximum production rates while maintaining the desired coating application thickness.

Examples of Purging Operation

In one example of the purging operation, compressed gas is used for flushing mixed plural component coatings from hoses, and other system components in contact with the mixed material. The purging method includes a high pressure and low pressure purge. In one example, the high pressure purge operates between 2000 and 3500 psi (135 to 235 Bar) and is used to rapidly expel the mixed coating material from the lines while still maintaining a good spray pattern. In one example, the high pressure purge only operates long enough to displace the material in the lines. Once the lines are rapidly flushed, the high pressure purge is stopped and the low pressure purge takes over. In one example, the low pressure purge normally operates between 150 psi and 250 Psi (10 to 17 Bar). In one example, the low pressure purge can go as high as 1000 psi (68 Bar). The low pressure purge removes any residual material from the lines and, in one example, allows the computer time to run through a tip cleaning procedure.

As previously discussed, a two pressure purging system prevents water condensation from occurring around the spray tip and contaminating the coating. Using a high pressure purge system alone results in an adiabatic expansion of the gas as it exits the spray tip. In certain environmental temperature and humidity conditions this causes the ambient temperature in the vicinity of the spray tip to drop below the dew point resulting in water being deposited on the coating material. With a two pressure purging process and system there is still an adiabatic expansion of the low pressure purge gas but resulting in a much smaller temperature reduction. In one example, a pressure regulator is provided to adjust the pressure of the low pressure purge. When there is a large temperature difference between the ambient temperature and the dew point, a "higher" low pressure purge is used.

In one example, the high pressure stage of the purge system is normally set at the atomization pressure used to spray the coating material. This allows the coating material in the lines to be purged out of the lines at the same pressure, maintaining the spray fan pattern that was obtained during coating application. This minimizes any irregularity in coating application. The atomization pressure is a function of the coating material properties and will vary from one coating to the next. In one example, higher pressures up to 4000 psi are used to obtain better results.

In one example, the high pressure purge is maintained just long enough to get the coating material purged out of the lines. The amount of time will depend on the diameter and length of the lines involved. In one example, normally the high pressure purge is maintained for less than one second.

In one example, low pressure purge is normally between 200 and 400 psi and is maintained only long enough to remove any remaining coating material left after the high pressure purge.

Examples of Flip Mechanism Operation

In one example of flip mechanism operation, the spray gun assemblies are designed to rotate the spray guns away from the pipe at about a 45 degree from the perpendicular spraying position. The rotation of each gun is created by two air cylinders. One cylinder causes the gun to rotate in a clockwise direction, the other cylinder causes the gun to rotate in a counterclockwise direction. In one example, there are two purposes for the flip motion. The first is to direct the gun away from the pipe while the oscillation drive is ramping down and then ramping up when changing directions. This prevents excess material from building up at these points and is intended to mimic the hand motion of an applicator when he reaches the end of a stroke. The flip mechanism is also employed at the start of the spraying operation and at the stopping of the spraying.

In this example of operation, the coating system has two spray guns. Gun 1 coats the side of the pipe closest to metering equipment. Gun 2 coats the side of the pipe farthest from the metering equipment. When Gun 1 approaches the 12:00 position a signal causes the solenoid to operate the cylinder causing the gun to rotate clockwise. The signal coincides with the signal to ramp down the oscillating motor prior to changing direction. The signal is broken once the motor direction is reversed and the motor starts to ramp back up. Once the signal is broken, the double acting cylinder reverses and the spray tip returns to the perpendicular spraying position. Similarly when gun 1 reaches the 6:00 reversal, the second solenoid operated cylinder causes Gun 1 to rotate counterclockwise in the same manner as described above. In one example, a programmable logic controller manages the signal and actuation of the cylinders and motor.

Gun 2 operates similarly to Gun 1 except that Gun 2 rotates counterclockwise at the 12:00 position and clockwise at the 6:00 position. This means that both Gun 1 and Gun 2 are rotated clockwise when Gun 1 is in the 12:00 position and both guns are rotated counterclockwise when Gun 1 is at the 6:00 position.

As mentioned, in one example, the flip mechanism is also employed at the start of the spraying operation and at the stopping of the spraying. Prior to the start of the spraying operation, Gun 1 is at the 3:00 position and is rotated counterclockwise. Gun 2 is at the 9:00 position and is rotated counterclockwise. This results in both guns pointing in a downward direction. When the spraying operation starts (component A and B open), an electric timer is started. The duration of the time delay is an operator input to the system. The purpose of this delay is to allow the material to reach the spray gun tip and would essentially be the volume of the hoses divided by the flow rate of the metering pump. Once the delay is over, the guns are rotated to the spraying position (i.e. the signal to the solenoid controlling the rotation is broken). At the same time, oscillation begins at the rate indicated by the pump flow rate.

In one example, the oscillating mechanism oscillates for the required number of passes. The number of passes is an operator-user input to the system. The speed of oscillation is determined by the pump flow rate. When the last pass is completed and the oscillation motor begins ramping down to stop, the purge sequence is started. At the same time, Gun 1 is rotated counterclockwise and Gun 2 clockwise for the duration of the purging sequence.

Additional examples of the physical system features are presented. In one example, a control panel is used to provide a single user-operator access to the major functions and major indicators of the line travel coating system. In one example, the control panel houses a programmable logic controller for monitoring and controlling all major functions of the system, including the recording of operating parameters for downloading to a computer. In this example, the control panel is powered by a 24 VDC transformer and contains electric-pneumatic solenoid valves to control the operation of Operators O1, O2, O34, O5, O6, O7, and O8. Push buttons permit the user-operator to easily start and stop the coating application and to test operation of the various valves and operators. Indicator lights indicate the position of the operators and the stage of the operating sequence. Flow meters to indicate the flow rate of Component A and Component B are also present. The logic controller is programmed to receive and react to the user-operator inputs. In one example, an interface with a computer, for example a programmed lap top computer, allows communication with the logic controller and modification of the various parameters.

In one example, a control console houses a Siemens PC677 computer and touch screen and controls all of the major operations of the line travel coating system. In one example, the control console is also equipped with a Wi-Fi modem that permits operation from any laptop computer that is programmed to connect to the secure Wi-Fi network. The user-operator controls the unit from the touch screens and/or the laptop computer.

In one example, an operator control panel is on a pendent and allows the user-operator to control the unit from a safe distance. In one example, the control panel allows the operator to do the following: perform an emergency stop; open or close tension wheels; circulate component material; perform line travel (forward or reverse); start and stop oscillation; return oscillation to a home position; start and stop spray; clean each spray gun; change mode between manual and automatic.

In one example, a "Motor Control Center" is employed to centralize various electronic and electric functions. In one example, the "Motor Control Center" is a NEMA 4X Stainless Steel Panel and includes the following: a variable frequency drive for control of the oscillating motor 316; a variable frequency drive for control of the line travel motor 212; a main circuit breaker; a control transformer, a Siemens S7 CPU 315 PLC System (the programmable logic controller); a vortex cooling system; and power control cable and quick disconnects (in one example, with quick disconnects at both ends).

In one example configuration of the line travel coating system, kit components are provided that provide different sizes of oscillation ring assembly 400. This allows the basic line travel coating system to be fitted to accommodate different pipe work piece sizes for various jobs. A particular aspect of this kit configuration is the pipe diameter ranges for each kit. In one example, these ranges are selected to cover varying pipe diameters that may be encountered in a single pipeline job, thereby reducing the number of kit change-outs required. In one example, three kit size ranges are provided: one for pipe diameters 500-760 mm, one for pipe diameters 800-1020 mm, and one for pipe diameters 1020-1420 mm. The three kits cover the entire range of 20-inch to 56-inch pipe.

In one example, the line travel drive module 200 attaches to the pipe size kit components. In one example, the oscillation drive mechanism 300 is mounted in only one location and does not need to be relocated to accommodate various pipe sizes within the pipe size kit range. The specific location of the line travel drive depends on the pipe diameter being worked on. In one example, the position of the line travel drive module is normally set in the shop. In another example, the position of the line travel drive module can be changed in the field to accommodate different pipe diameters on the same job. In one example, the line travel drive module itself requires no adjustment to accommodate varying pipe diameters.

In one example, each kit contains a "Main Frame Kit" and an oscillation ring assembly 400. The "Main Frame Kit" includes front and back mounting plates, and support legs. The oscillation ring assembly 400 mounts to the front plate and is connected to the oscillation drive mechanism 300 using a roller chain 310. The spray gun assemblies 500 mount to the oscillation ring assembly 400.

In one example, spray gun flip mechanism mounts 426 are used to hold the spray gun assemblies 500 in the proper position for automated coating operation. In one example, two or three flip mechanism mounts 426 are required depending on how the system is configured. They mount to the pipe size kit oscillating ring assembly. In the kit example, flip mechanism mounts 426 and spray gun assemblies 500 are not size specific and can be used on any pipe size kit. In one example, the flip mechanism mounts 426 and spray gun assemblies 500 include the following components: mounting bracket, applicator assembly, flip mechanism assembly, and junction box with pneumatic solenoids for valve operation.

In one example, two tension wheel modules attach to the pipe size kits and provide the tension necessary for the drive rollers to move the unit up and down slopes. These mount at one point on the pipe size kits and can be easily adjusted to accommodate the different pipe sizes in the pipe size range. In one example, the tension modules rotate balloon tires inward using air cylinders until they contact the pipe. The balloon tires are opened up to permit the unit to be placed on and taken off the pipeline. In one example, the tension wheels are opened and closed manually. In another example, the tension wheels are opened and closed through operation of the logic controller.

The foregoing disclosure is presented for purposes of illustration and description, and is not intended to limit the invention to the forms disclosed herein. Consequently, variations and modifications commensurate with the above teachings and the teaching of the relevant art are within the spirit of the invention. Such variations will readily suggest themselves to those skilled in the relevant in the art having the benefit of the present disclosure. Further, the embodiments described are also intended to explain the best mode for carrying out the invention, and to enable others skilled in the art to utilize the invention and such or other embodiments and with various modifications required by the particular applications or uses of the invention. It is intended that the claims based on this disclosure be construed to include alternative embodiments to the extent that is permitted by prior art.

What is claimed:

1. A method for coating a non-rotating pipe work piece comprising:

flowing a first component material and a second component material;

measuring at least one parameter of the flow of at least one component material;

mixing the component materials;

applying the mixed component materials to the outside surface of the work piece in an arcuate trajectory about the axis of the work piece, wherein the applying comprises oscillating at least two spray guns applying the mixed component materials about the work piece and traversing the at least two spray guns along an axial direction of the work piece;

adjusting the frequency of oscillation of the at least two spray guns based at least in part on at least one parameter of the flow of the components and based at least in part on a selected coating thickness and based at least in part on a selected spray width and based at least in part on the outer diameter of the work piece; and adjusting the speed of traversing the at least two spray guns along an axial direction of the work piece based at least in part on the oscillation frequency and based at least in part on the selected spray width.

2. The method of claim 1 further comprising the step of verifying the ratio of the flow of the two components.

3. The method of claim 2 further comprising stopping application of the mixed component materials to the outside surface of the work piece based on the ratio of the flow of the two components.

4. The method of claim 1 wherein the step of adjusting the oscillation frequency is further based at least in part on allowance for overspray.

5. The method of claim 1 wherein the step of adjusting the oscillation frequency is further based at least in part on a selected number of rotational degrees.

6. The method of claim 1 wherein the step of adjusting the oscillation frequency is further based at least in part on a selected number of passes.

7. A method for coating a non-rotating pipe work piece comprising:

spraying a coating about the outside surface of the work piece along an oscillating arcuate path;

reversing the direction while spraying along the arcuate path;

rotating the spray away from the work piece when reversing the direction of the arcuate path of the spray, including a spray gun assembly having a split-hinge mount having actuation members configured and arranged to rotate a spray gun about an axis of the spray gun assembly upon actuation of any actuation member; and wherein the rotation of the spray away from the work piece is in the direction of the arcuate path prior to reversing direction.

8. The method of claim 7 wherein spraying a coating further comprises at least two spray patterns disposed at opposing locations about the outside surface of the work piece, the at least two spray patterns oscillating in unison along the arc-like path, and each spray pattern rotated away from the work piece when reversing the direction of the arc-like path of the spray, the rotation in the direction of the arc-like path prior to reversing direction.

* * * * *